(12) United States Patent
Asai et al.

(10) Patent No.: US 11,667,836 B2
(45) Date of Patent: *Jun. 6, 2023

(54) LIGHT EMITTING DEVICE

(71) Applicant: NICHIA CORPORATION, Anan (JP)

(72) Inventors: Kenji Asai, Naruto (JP); Kazushige Fujio, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,756

(22) Filed: Apr. 3, 2022

(65) Prior Publication Data

US 2022/0223764 A1 Jul. 14, 2022

Related U.S. Application Data

(63) Continuation of application No. 16/833,487, filed on Mar. 27, 2020, now Pat. No. 11,329,197.

(30) Foreign Application Priority Data

Mar. 29, 2019 (JP) .............................. JP2019-068533
Mar. 17, 2020 (JP) .............................. JP2020-046457

(51) Int. Cl.
*C09K 11/77* (2006.01)
*H01L 25/075* (2006.01)
(Continued)

(52) U.S. Cl.
CPC ...... *C09K 11/7734* (2013.01); *C09K 11/7774* (2013.01); *C09K 11/77342* (2021.01);
(Continued)

(58) Field of Classification Search
CPC . H01L 33/502; H01L 25/0753; H01L 33/507; H01L 33/504; H05B 47/155;
(Continued)

(56) References Cited

U.S. PATENT DOCUMENTS 8,203,260 B2   6/2012  Li et al.
8,410,714 B2   4/2013  Kasakura et al.
(Continued)

FOREIGN PATENT DOCUMENTS

EP   2489717 B1    10/2018
JP   2009004325 A   1/2009
(Continued)

OTHER PUBLICATIONS

Kandilarov, Rostislav, Y., et al., "Method and equipment for controlling LED lamp for therapeutic purposes", 2017 KXVI International Scientific Conference Electronics (ET), Sep. 2017, DOI: 10.1109/ET.2017.8124353, 4 pages.
(Continued)

*Primary Examiner* — Kevin Quarterman
(74) *Attorney, Agent, or Firm* — Hunton Andrews Kurth LLP

(57) ABSTRACT

A light emitting device includes a first light source containing a first light emitting element, and a second light source containing a second light emitting element and a second fluorescent material, the first light source emits light in a region that is demarcated in a chromaticity diagram of the CIE 1931 color coordinate system by a first straight line connecting a first point having x,y of 0.280, 0.070 in the chromaticity coordinate and a second point having x,y of 0.280, 0.500 in the chromaticity coordinate, a second straight line connecting the second point and a third point having x,y of 0.013, 0.500 in the chromaticity coordinate, a purple boundary extending from the first point toward a direction in which x decreases in the chromaticity coordinate, and a spectrum locus extending from the third point toward a direction in which y decreases in the chromaticity coordinate, in a light emission spectrum, a light emission intensity ratio $I_{PM}/I_{PL}$ of a light emission intensity $I_{PM}$ at a
(Continued)

wavelength of 490 nm with respect to a light emission intensity $I_{PL}$ at a maximum light emission peak wavelength of the first light emitting element is in a range of 0.22 or more and 0.95 or less, the second light source emits light having a color deviation duv from a blackbody radiation locus in a range of −0.02 or more and 0.02 or less measured according to JIS Z8725 with a correlated color temperature in a range of 1,500 K or more and 8,000 K or less in a chromaticity diagram of the CIE 1931 color coordinate system, and the light emitting device emits mixed color light of light emitted from the first light source and light emitted from the second light source.

4 Claims, 14 Drawing Sheets

(51) Int. Cl.
  *H01L 33/50* (2010.01)
  *H05B 47/155* (2020.01)
  *H05B 45/10* (2020.01)
(52) U.S. Cl.
  CPC .... *C09K 11/77348* (2021.01); *H01L 25/0753* (2013.01); *H01L 33/502* (2013.01); *H01L 33/507* (2013.01); *H05B 45/10* (2020.01); *H05B 47/155* (2020.01)
(58) Field of Classification Search
  CPC ............... H05B 45/10; C09K 11/7733; C09K 11/7774; C09K 11/7734
  See application file for complete search history.

(56) References Cited

U.S. PATENT DOCUMENTS

| | | | |
|---|---|---|---|
| 8,773,337 | B2 | 7/2014 | Li et al. |
| 8,847,507 | B2 | 9/2014 | Kasakura et al. |
| 11,329,197 | B2 * | 5/2022 | Asai ..................... H01L 33/502 |
| 2007/0284994 | A1 | 12/2007 | Morimoto et al. |
| 2008/0252197 | A1 | 10/2008 | Li et al. |
| 2010/0295464 | A1 | 11/2010 | Kasakura et al. |
| 2011/0204805 | A1 | 8/2011 | Li et al. |
| 2011/0211336 | A1 | 9/2011 | Oshio |
| 2013/0044456 | A1 | 2/2013 | Takei et al. |
| 2013/0221866 | A1 | 8/2013 | Kasakura et al. |
| 2014/0307417 | A1 | 10/2014 | Yamakawa et al. |
| 2016/0276549 | A1 | 9/2016 | Yamashita et al. |
| 2018/0015712 | A1 | 1/2018 | Skinner et al. |
| 2018/0076181 | A1 | 3/2018 | Onuma et al. |
| 2019/0097098 | A1 | 3/2019 | Fujio et al. |

FOREIGN PATENT DOCUMENTS

| | | |
|---|---|---|
| JP | 2009238729 A | 10/2009 |
| JP | 2010524255 A | 7/2010 |
| JP | 2012156209 A | 8/2012 |
| JP | 2014120708 A | 6/2014 |
| JP | 2014212082 A | 11/2014 |
| JP | 2015115507 A | 6/2015 |
| JP | 2017079200 A | 4/2017 |
| JP | 2018129492 A | 8/2018 |

OTHER PUBLICATIONS

Notice of Allowance, United States Patent and Trademark Office, issued to U.S. Appl. No. 16/833,487 dated Jan. 3, 2022, 8 pages.
Non-Final Office Action, United States Patent and Trademark Office, issued to U.S. Appl. No. 16/833,487 dated Sep. 22, 2021, 12 pages.

* cited by examiner

LIGHT EMITTING DEVICE

CROSS-REFERENCE TO RELATED PATENT APPLICATION

This is a continuation application of U.S. patent application Ser. No. 16/833,487, filed Mar. 27, 2020, which claims priority to Japanese Patent Application No. 2019-068533, filed on Mar. 29, 2019, and Japanese Patent Application No. 2020-46457 filed on Mar. 17, 2020, the entire disclosures of which is hereby incorporated by reference in their entireties.

BACKGROUND

Technical Field

The present disclosure relates to a light emitting device.

Description of Related Art

As a light emitting device using a light emitting element, such as a light emitting diode (which may be hereinafter abbreviated as "LED"), a light emitting device that emits white based mixed color light by using a light emitting element emitting blue light and a fluorescent material emitting yellow light through excitation with light from the light emitting element has been known. The light emitting device of this type has been used in a wide variety of fields including general illuminations, automobile illuminations, displays, backlights for liquid crystal displays.

There have been reports that the onset probabilities of sleep disorder and depression tend to increase in the high-latitude regions with relatively less sunshine durations (for example, Northern Europe and Northern America, and Tohoku district and the like in Japan).

It has been considered that one of the factors of the high onset probabilities of sleep disorder and depression in the regions with less sunshine durations relates to a disorder of the circadian rhythm. The term "circadian" is a compound word of Latin words, "circa" meaning "approximate" and "dies" meaning "one day". Humans wake and sleep in daily cycle depending on the biological clock functioning inside the body rather than the external environmental factors including the change in luminance. The human rhythmic cycle of sleep and body temperature is approximately 25 hours, which is slightly longer than one day, but in the normal life, is synchronized by compensating the phase of the biological clock through the stimulation of the external environmental change. Organisms utilize light as the synchronization factor, and humans with a 25-hour cycle synchronizes by advancing the phase with light in the morning, whereas a line of mice with a 23-hour cycle synchronizes by delaying the phase with light before the sunset. Accordingly, the control of the biological clock with light as a trigger is significantly important in the establishment of the circadian rhythm.

A new light receptor other than the rod cells and the cone cells was found on the retina of mammals in 2002 and named as an intrinsically photosensitive retinal ganglion cell (ipRGC). The ipRGC has melanopsin, a visual pigment, and has been demonstrated to have participation to the non-visual functions including the light synchronization of the circadian rhythm, the pupillary response. The ipRGC is a cell that provides light signals by projecting directly on the suprachiasmatic nucleus. The suprachiasmatic nucleus, which is a small region in the hypothalamus of the brain, assumes the role of the biological clock controlling the circadian rhythm of mammals, and creates the circadian rhythm of the various physiological functions including, sleep, waking, blood pressure, body temperature, hormonal secretion by approximately 20,000 nerve cells. Accordingly, the control of the endogenous light response by the ipRGC is significantly important in the establishment of the circadian rhythm.

Melanopsin of the ipRGC expresses a light receptor protein in the cells corresponding to approximately from 1% to 2% of the retinal ganglion cells. The other large proportion of the retinal ganglion cells does not have light sensitivity. The light receptor substance has been known to have different absorption characteristics depending on the cells, and melanopsin has a peak wavelength of around from 480 nm to 490 nm. Opsin of the cone cells has a peak wavelength of around 440 nm for the S cone cells, around 535 nm for the M cone cells, and around 565 nm for the L cone cells, and rhodopsin of the rod cells has a peak wavelength of around 507 nm.

Melanopsin has been said to have participation to the secretion and suppression of melatonin, which is a sleep promoting hormone, and for example, it is considered that the increase of the stimulus quantity to the ipRGC suppresses the secretion of melatonin. Melatonin has a secretion peak during the night, and the secretion of melatonin makes humans sleepy to promote sleep. For example, as for an indoor worker passing the time in most of the day under artificial light, the light that the worker receives is a significantly important factor. Specifically, for facilitating the establishment of the human circadian rhythm, humans should receive light corresponding to the active time zones, and it is considered that light that suppresses the secretion of melatonin is preferred during morning to noon, whereas light that promotes the secretion of melatonin is preferred in the evening to the sunset.

In recent years, the concept of human centric lighting (HCL), which is an illumination centering on humans, is beginning to spread widely. The HCL aims to enhance the power of concentration of humans passing the time under an artificial illumination and to improve the circadian rhythm of the humans by controlling the brightness and the color of the illumination. The WELL Certification (WELL Building Standard) focusing on the health of indoor workers, which is a new certification system that evaluates the human health along with the environmental and energy capabilities, is managed by IWBI (International WELL Building Institute), and the certification operation is performed by GBCI (Green Business Certification Incorporated). The WELL Certification includes the illumination considering the circadian rhythm as an essential item, in which the equivalent melanopic lux is used as a quantitative unit for the brightness influencing the circadian rhythm. As for the equivalent melanopic lux, the equivalent melanopic lux on the vertical plane is demanded to be 250 lux or more while satisfying the condition of 75% or more of the working space and 4 hours or more per one day. The equivalent melanopic lux can be obtained by the following expression (1). The calculation of the equivalent melanopic lux requires the melanopic ratio, which can be obtained by the following expression (2).

$$(\text{equivalent melanopic lux}) = (\text{illuminance}) \times (\text{melanopic ratio}) \quad (1)$$

$$\text{Melanopic ratio} = \frac{\sum_{730}^{380} \text{Lamp} \times \text{Circadian}}{\sum_{730}^{380} \text{Lamp} \times \text{Visual}} \times 1.218 \quad (2)$$

In the expression (2), (Lamp×Circadian) is the circadian response contained in the spectral distribution of the light source, (Lamp×Visual) is the visibility response contained in the spectral distribution of the light source, and 1.218 is the constant (lux factor). In the expression (2), the term "Lamp" shows the spectral distribution of the light source. In the expression (2), the term "Circadian" shows the sensitivity curve (absorbance) of ipRGC, which is a light receptor on the retina of mammals. In the expression (2), the term "Visual" shows the visibility curve in the human photopic vision.

The circadian response of melanopsin as the ipRGC is used as the circadian response curve contained in the spectral distribution of the light source for obtaining the melanopic ratio. The human visibility response is used as the visibility curve. Consequently, it can be understood that with a higher melanopic ratio, the spectral distribution can stimulate the circadian rhythm more strongly.

Artificial light that facilitates the establishment of the human circadian rhythm includes an LED tonable and dimmable illumination. The LED tonable and dimmable illumination is an illumination device capable of changing the color temperature (tonable) and changing the brightness (dimmable) by providing mixed color light through the control of LEDs emitting light with different color tones in the vicinity of the blackbody radiation locus. In the illumination device of this type, the melanopic ratio is changed along with the change of the color tone, which is however only the change of the wavelength component ratio corresponding to the change of the color temperature, and for example, the melanopic ratio is low in the high color temperature where the light has white color. There is a tendency that the melanopic ratio is increased with the increase of the color rendering capability of light emitted from the illumination device since the melanopic ratio is influenced by the component of around 480 nm to 490 nm, but there is a tendency that the light emission efficiency is decreased by increasing the color rendering capability, which are in a trade-off relationship. For providing the illumination considering the circadian rhythm under the circumstances, it is required to achieve simultaneously both the control of the melanopic ratio corresponding to the circadian rhythm in controlling the color tone and the maintenance of the light emission efficiency in controlling the melanopic ratio.

For example, Japanese Unexamined Patent Publication No. 2018-129492 proposes, as a light emitting device and an illumination device capable of controlling the chromaticity of emitted light, a light emitting device using a combination of white light having a chromaticity positioned on the blackbody radiation and blue monochromatic light emitted from a light emitting element.

SUMMARY

However, it is difficult to achieve simultaneously both the control of the melanopic ratio and the maintenance of the light emission efficiency by the ordinary tonable and dimmable illumination with LEDs that are in the vicinity the blackbody radiation locus and are different in color tone. In the case where the color tone is controlled with blue monochromatic light, the color deviation is changed with the substantially same color temperature, and thus the chromaticity after the control largely deviates from the blackbody radiation. For achieving the illumination considering the circadian rhythm, the chronological change of sunlight is necessarily reproduced as the basic premise, and thus the chromaticity obtained by toning is preferably in the vicinity of the blackbody radiation locus, but the blue monochromatic light has a problem in the chromaticity in toning. Furthermore, for effectively controlling the melanopic ratio corresponding to the toning, the light source to be combined preferably contains a light emission component having a wavelength of from 480 nm to 490 nm, but this effect is insufficient with blue monochromatic light. Moreover, in the case where the direction of the control of the chromaticity is the negative direction in color deviation, the visibility component is reduced from the spectral distribution, and thus the light emission efficiency is decreased.

An object of an embodiment of the present disclosure is to provide a light emitting device that is capable of achieving simultaneously both the control of the melanopic ratio considering the circadian rhythm and the maintenance of the light emission efficiency.

A first embodiment of the present disclosure relates to a light emitting device including a first light source containing a first light emitting element having a light emission peak wavelength in a range of 410 nm or more and 490 nm or less, and a second light source containing a second light emitting element having a light emission peak wavelength in a range of 410 nm or more and 460 nm or less, and a second fluorescent material emitting light through excitation by the second light emitting element, wherein the first light source emits light in a region that is demarcated in a chromaticity diagram of the CIE 1931 color coordinate system by a first straight line connecting a first point having x of 0.280 and y of 0.070 in the chromaticity coordinate and a second point having x of 0.280 and y of 0.500 in the chromaticity coordinate, a second straight line connecting the second point and a third point having x of 0.013 and y of 0.500 in the chromaticity coordinate, a purple boundary extending from the first point toward a direction in which x decreases in the chromaticity coordinate, and a spectrum locus extending from the third point toward a direction in which y decreases in the chromaticity coordinate, wherein in a light emission spectrum, a light emission intensity ratio $I_{PM}/I_{PL}$ of a light emission intensity $I_{PM}$ at a wavelength of 490 nm with respect to a light emission intensity $I_{PL}$ at a maximum light emission peak wavelength of the first light emitting element is in a range of 0.22 or more and 0.95 or less, wherein the second light source emits light having a color deviation duv from a blackbody radiation locus in a range of −0.02 or more and 0.02 or less measured according to JIS Z8725 with a correlated color temperature in a range of 1,500 K or more and 8,000 K or less in a chromaticity diagram of the CIE 1931 color coordinate system, and wherein the light emitting device emitting mixed color light of light emitted from the first light source and light emitted from the second light source. The "purple boundary" is the locus connecting both the red end and the purple end of the spectrum locus formed in the chromaticity diagram. The colors on the purple boundary are colors that are not formed with monochromatic light (red to magenta), and colors that are formed through color mixing. The "spectrum locus" means the curve obtained by connecting chromaticity points of monochromic (pure color) light in the chromaticity diagram. The chromaticity diagram of the CIE color coordinate system is defined by Commission Internationale de l'Eclairage (CIE). For the first light emitting element and the second light emitting element, the light emission spectrum is measured with an omnidirectional integrating sphere, and the wavelength exhibiting the highest light emission intensity in the light emission spectrum is designated as the light emission peak wavelength. The light emission intensity at the light emission peak wavelength of the first light emitting element is designated as the light emission intensity $I_{PL}$. For the light emitting device, the light emission spectrum is measured with a spectrofluorophotometer, and the light emission intensity at a wavelength of 490 nm in the light emission spectrum is designated as the light emission intensity $I_{PM}$. The chromaticity coordinate (chromaticity x,y) of the light emission color of the light emitting device is measured with an optical measurement system having a combination of a multi-channel spectroscope and an integral sphere. For the second light source, the chromaticity coordinate (chromaticity x,y) of the light emission color, the correlated color temperature (Tcp; K) according to JIS Z8725, the color deviation duv from the blackbody radiation locus, and the average color rendering index Ra according to JIS Z8726 are measured with an optical measurement system having a combination of a multi-channel spectroscope and an integral sphere.

According to an embodiment of the present disclosure, a light emitting device that is capable of achieving simultaneously both the control of the melanopic ratio considering the circadian rhythm and the maintenance of the light emission efficiency can be provided.

DETAILED DESCRIPTION

Figure 1:
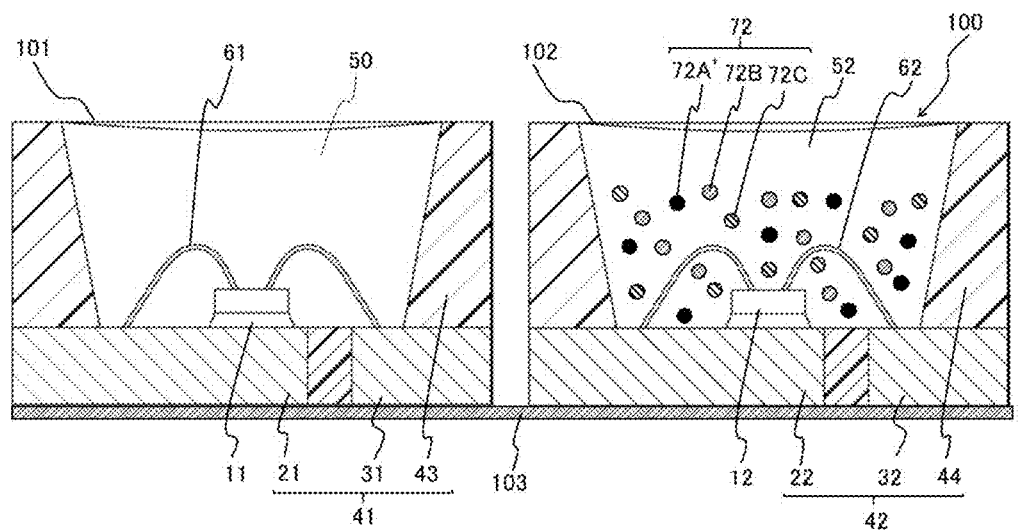
FIG. 1 is a schematic cross sectional view showing one example of a light emitting device.

The light emitting device of the present disclosure will be described with reference to embodiments. However, the embodiments shown below are only examples for realizing the technical concept of the present invention, and the present invention is not limited to the light emitting devices shown below. The relationships between the color names and the chromaticity coordinates, the relationships between the wavelength ranges of light and the color names are in accordance with JIS Z8110.

The light emitting device includes a first light source containing a first light emitting element having a light emission peak wavelength in a range of 410 nm or more and 490 nm or less, and a second light source containing a second light emitting element having a light emission peak wavelength in a range of 410 nm or more and 460 nm or less, and a second fluorescent material emitting light through excitation by the second light emitting element. The first light source emits light in a region (which may be hereinafter referred to as a "light emission region LSa of the first light source") that is demarcated in a chromaticity diagram of the CIE 1931 color coordinate system by a first straight line connecting a first point having x of 0.280 and y of 0.070 in the chromaticity coordinate and a second point having x of 0.280 and y of 0.500 in the chromaticity coordinate, a second straight line connecting the second point and a third point having x of 0.013 and y of 0.500 in the chromaticity coordinate, a purple boundary extending from the first point toward a direction in which x decreases in the chromaticity coordinate, and a spectrum locus extending from the third point toward a direction in which y decreases in the chromaticity coordinate. The "purple boundary" is the locus connecting both the red end and the purple end of the spectrum locus formed in the chromaticity diagram. The colors on the purple boundary are colors that are not formed with monochromatic light (red to magenta), and colors that are formed through color mixing. The "spectrum locus" means the curve obtained by connecting chromaticity points of monochromic (pure color) light in the chromaticity diagram. The chromaticity diagram of the CIE color coordinate system is defined by Commission Internationale de l'Eclairage (CIE). In a light emission spectrum of the light emitting device, a light emission intensity ratio $I_{PM}/I_{PL}$ of a light emission intensity $I_{PM}$ at a wavelength of 490 nm with respect to a light emission intensity $I_{PL}$ at a maximum light emission peak wavelength of the first light emitting element is in a range of 0.22 or more and 0.95 or less. The second light source emits light having a color deviation duv from a blackbody radiation locus in a range of −0.02 or more and 0.02 or less measured according to JIS Z8725 with a correlated color temperature in a range of 1,500 K or more and 8,000 K or less in a chromaticity diagram of the CIE 1931 color coordinate system. The light emitting device emits mixed color light of light emitted from the first light source and light emitted from the second light source. For the first light emitting element and the second light emitting element, the light emission spectrum was measured with an omnidirectional integrating sphere, and the wavelength exhibiting the highest light emission intensity in the light emission spectrum is designated as the light emission peak wavelength. The light emission intensity at the light emission peak wavelength of the first light emitting element is designated as the light emission intensity $I_{PL}$. For the light emitting device, the light emission spectrum is measured with a spectrofluorophotometer, and the light emission intensity at a wavelength of 490 nm in the light emission spectrum is designated as the light emission intensity $I_{PM}$. The chromaticity coordinate (chromaticity x,y) of the light emission color of the light emitting device is measured with an optical measurement system having a combination of a multi-channel spectroscope and an integral sphere. For the second light source, the chromaticity coordinate (chromaticity x,y) of the light emission color, the correlated color temperature (Tcp; K) according to JIS Z8725, the color deviation duv from the blackbody radiation locus, and the average color rendering index Ra according to JIS Z8726 are measured with an optical measurement system having a combination of a multi-channel spectroscope and an integral sphere.

One example of a light emitting device of an embodiment of the present disclosure will be described with reference to the drawing. FIG. 1 is a schematic cross sectional view showing a light emitting device 100 of an embodiment of the present disclosure.

The light emitting device 100 includes a first light source 101 containing a first light emitting element 11 having a light emission peak wavelength in a range of 410 nm or more and 490 nm or less covered with a covering member 50, and a second light source 102 containing a second light emitting element 12 having a light emission peak wavelength in a range of 410 nm or more and 460 nm or less, and a fluorescent member 52 containing a second fluorescent material 72 emitting light through excitation with light emitted from the second light emitting element 12. The light emitting device 100 has a substrate 103, on which the first light source 101 and the second light source 102 are disposed. In the description herein, the light emitting material contained in the second light source 102 is referred to as a second fluorescent material 72. As described later, the fluorescent material contained in the first light source 101 is referred to as a first fluorescent material 71. In this specification, the "fluorescent material" is used in the same meaning as a "fluorescent phosphor".

The first light source 101 and the second light source 102 have molded articles 41 and 42 respectively, and the first light emitting element 11 and the second light emitting element 12 respectively. The molded articles 41 and 42 have first leads 21 and 22 and second leads 31 and 32 respectively, and are molded integrally with resin portions 43 and 44 containing a thermoplastic resin or a thermosetting resin respectively. The molded articles 41 and 42 each have a concave portion having a bottom surface and a side surface, and the first light emitting element 11 or the second light emitting element 12 is disposed on the bottom surface of the concave portion. The first light emitting element 11 and the second light emitting element 12 each have one pair of positive and negative electrodes, and the one pair of positive and negative electrodes are electrically connected to the first leads 21 and 22 and the second leads 31 and 32 through wires 61 and 62 respectively. The first light emitting element 11 and the second light emitting element 12 are covered with a covering member 50 and a fluorescent member 52 respectively. The covering member 50 contains a sealing material. The fluorescent member 52 contains the second fluorescent material 72 performing wavelength conversion of light emitted from the second light emitting element 12 and a sealing material. The first fluorescent material 71 and the second fluorescent material 72 each have at least one light emission peak wavelength in a particular wavelength range through excitation with light emitted from the first light emitting element 11 or the second light emitting element 12, and may contain two or more kinds of fluorescent materials having different wavelength ranges of the light emission peak wavelength. The first light source 101 and the second light source 102 emit light by externally supplying electric power through the first leads 21 and 22 and the second leads 31 and 32 respectively, and mixed color light of the light emitted from the first light source 101 and the light emitted from the second light source 102 is emitted from the light emitting device 100.

The first light emitting element 11 and the second light emitting element 12 are used as excitation light sources. The first light emitting element 11 has a light emission peak wavelength in a range of 410 nm or more and 490 nm or less. The first light emitting element 11 provided in the first light source 101 may be constituted by plural light emitting elements, and the plural light emitting elements each may have a light emission peak wavelength in the aforementioned wavelength range and may have light emission peak wavelengths that are different from each other. The second light emitting element 12 has a light emission peak wavelength in a range of 410 nm or more and 460 nm or less. The second light emitting element 12 provided in the second light source 102 may be constituted by plural light emitting elements, and the plural light emitting elements each may have a light emission peak wavelength in the aforementioned wavelength range and may have light emission peak wavelengths that are different from each other. The first light emitting element 11 and the second light emitting element 12 each may have a full width at half maximum in the light emission spectrum, for example, of 30 nm or less, 25 nm or less, or 20 nm or less. The full width at half maximum means the full width at half maximum (FWHM) of the light emission peak in the light emission spectrum, which means the wavelength width of the light emission peak at 50% of the maximum value of the light emission peak in the light emission spectrum. The first light emitting element 11 and the second light emitting element 12 each are preferably, for example, a semiconductor light emitting element using a nitride semiconductor ($In_XAl_YGa_{1-X-Y}N$, wherein $0 \le X$, $0 \le Y$, and $X+Y \le 1$). The use of the semiconductor light emitting elements as the first light emitting element 11 and the second light emitting element 12 may provide the light emitting device having the first light source 101 and the second light source 102 that have high efficiency, high linearity of output with respect to input, and high stability against mechanical impacts.

Figure 2:
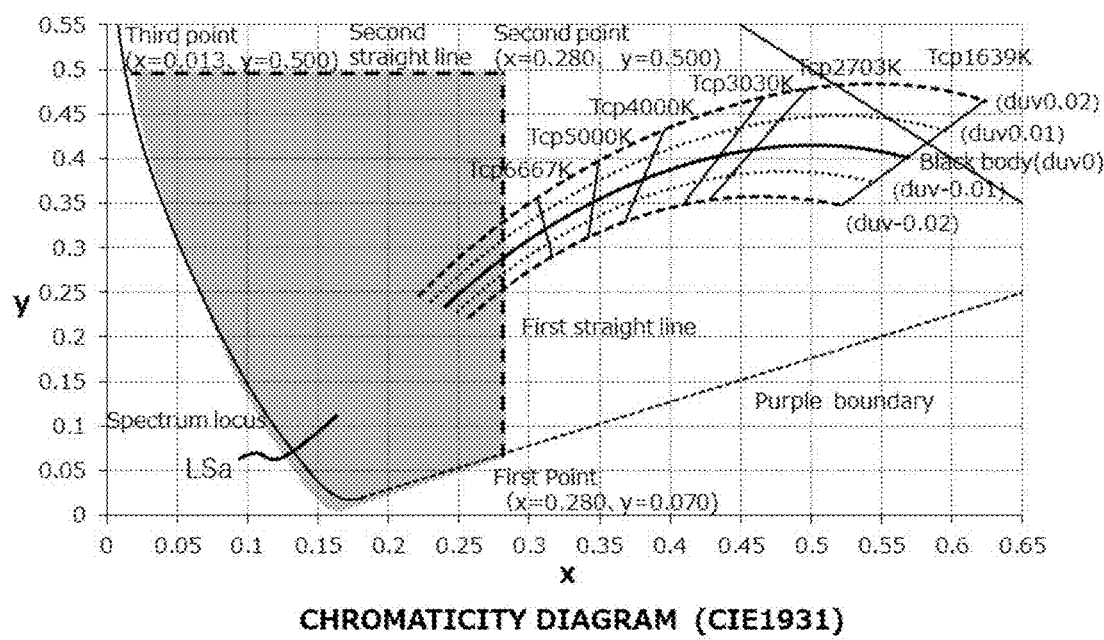
FIG. 2 is a part of the chromaticity diagram of the CIE 1931 color coordinate system, and is a diagram showing the light emission region LSa of the first light source, the blackbody radiation locus (having duv of 0), and the loci having a color deviation duv of –0.02, duv of –0.01, duv of 0.01, and duv of 0.02 from the blackbody radiation locus at the correlated color temperatures.

FIG. 2 shows the light emission region LSa of the first light source 101 in the chromaticity diagram of the CIE 1931 color coordinate system. The first light source 101 emits light in the light emission region LSa of the first light source 101, which is the region that is demarcated in the chromaticity diagram of the CIE 1931 color coordinate system by a first straight line connecting a first point (x=0.280, y=0.070) in the chromaticity coordinate and a second point (x=0.280, y=0.500) in the chromaticity coordinate, a second straight line connecting the second point (x=0.280, y=0.500) and a third point (x=0.013, y=0.500) in the chromaticity coordinate, a purple boundary extending from the first point (x=0.280, y=0.070) toward the direction in which x decreases in the chromaticity coordinate, and a spectrum locus extending from the third point (x=0.013, y=0.500) toward the direction in which y decreases in the chromaticity coordinate. With the first light source 101 that emits light in the light emission region LSa of the first light source, the light emitting device can emit light containing a light emission component within a wavelength range of from 480 nm to 490 nm, and the melanopic ratio can be effectively controlled corresponding to the toning for providing the target color temperature, providing the illumination considering the circadian rhythm. In the description herein, the light emission component having a wavelength of from 480 nm to 490 nm influencing the melanopic ratio may be referred to as a circadian component in some cases. The first point preferably has x of 0.270 and y of 0.063, and more preferably x of 0.260 and y of 0.059. The second point preferably has x of 0.270 and y of 0.490, and more preferably x of 0.260 and y of 0.480. The third point preferably has x of 0.014 and y of 0.490, and more preferably x of 0.015 and y of 0.480.

A preferred range of the light emission region LSa in the chromaticity coordinate of the first light source is a region that is demarcated by the first straight line connecting the first point (x=0.270, y=0.063) and the second point (x=0.270, y=0.490), the second straight line connecting the second point (x=0.270, y=0.490) and the third point (x=0.014, y=0.490), the purple boundary extending from the first point (x=0.270, y=0.063) toward the direction in which x decreases in the chromaticity coordinate, and the spectrum locus extending from the third point (x=0.014, y=0.490) toward the direction in which y decreases in the chromaticity coordinate.

A more preferred range of the light emission region LSa in the chromaticity coordinate of the first light source is a region that is demarcated by the first straight line connecting the first point (x=0.260, y=0.059) and the second point (x=0.260, y=0.480), the second straight line connecting the second point (x=0.260, y=0.480) and the third point (x=0.015, y=0.480), the purple boundary extending from the first point (x=0.260, y=0.059) toward the direction in which x decreases in the chromaticity coordinate, and the spectrum locus extending from the third point (x=0.015, y=0.480) toward the direction in which y decreases in the chromaticity coordinate.

The first light source 101 has, in the light emission spectrum of the light emitting device, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 derived from the light emitted from the first light source 101 that is in a range of 0.22 or more and 0.95 or less. The light having a wavelength of 490 nm is light that participates in melanopsin as the ipRGC influencing the secretion of melatonin, and in the light emission spectrum, the light emission intensity at a wavelength of 490 nm may be referred to as a melanopic light emission intensity $I_{PM}$. In the case where the light emission intensity ratio $I_{PM}/I_{PL}$ of the melanopic light emission intensity $I_{PM}$ with respect to the light emission intensity $I_{PL}$ at the maximum light emission peak wavelength of the first light emitting element 11 in the light emission spectrum of the light emitting device is in a range of 0.22 or more and 0.95 or less, such a light emission spectrum can be obtained that is close to the circadian response curve using the circadian response of melanopsin as the ipRGC, and the melanopic ratio can be controlled corresponding to the human circadian rhythm. Furthermore, the light emitting device can provide mixed color light that maintains the target light emission efficiency by the light emitted from the first light source 101 and the light emitted from the second light source 102. In the case where the light emission intensity ratio $I_{PM}/I_{PL}$ in the light emission spectrum of the light emitting device is in a range of 0.22 or more and 0.95 or less, the light emitted from the first light source and the light emitted from the second light source are toned, and with a correlated color temperature in a range of 4,000 K or more and 8,000 K or less, for example, assuming that the melanopic ratio where light emitted from the second light source is toned with each other is 100%, the melanopic ratio can be relatively increased by a range of 1% or more and 35% or less, and the melanopic ratio stimulating the human circadian rhythm can be controlled. In the light emission spectrum of the light emitting device, the light emission intensity ratio $I_{PM}/I_{PL}$ is preferably in a range of 0.25 or more and 0.90 or less, more preferably in a range of 0.29 or more and 0.85 or less, further preferably in a range of 0.30 or more and 0.82 or less, and particularly preferably in a range of 0.35 or more and 0.80 or less.

The light emission intensity $I_{PM}$ shows the light emission intensity at 490 nm, which is the maximum light emission peak wavelength of the circadian response curve using the response of melanopsin as the ipRGC (i.e., the melanopic light emission intensity). The light emission intensity $I_{PL}$ shows the light emission intensity at the maximum light emission peak wavelength of the excitation light source. The light emission intensity ratio $I_{PM}/I_{PL}$ shows the melanopic light emission intensity $I_{PM}$ with respect to the light emission intensity $I_{PL}$ of the excitation light source. In the case where the light emission intensity ratio $I_{PM}/I_{PL}$ is less than 0.22, the melanopic light emission intensity is too small with respect to the light emission intensity of the excitation light source, and the light emitting device fails to control the melanopic ratio corresponding to the human circadian rhythm. In the case where the light emission intensity ratio $I_{PM}/I_{PL}$ exceeds 0.95, the melanopic light emission intensity is too large with respect to the light emission intensity of the excitation light source, failing to control the melanopic ratio corresponding to the human circadian rhythm.

FIG. 2 shows the blackbody radiation locus and the range of the color deviation duv of −0.02 or more and 0.02 or less, which is the deviation from the blackbody radiation locus in the chromaticity diagram of the CIE 1931 color coordinate system. The second light source emits light having a color deviation duv from the blackbody radiation locus in a range of −0.02 or more and 0.02 or less measured according to JIS Z8725 with a correlated color temperature in a range of 1,500 K or more and 8,000 K or less in the chromaticity diagram of the CIE 1931 color coordinate system. In the case where the light emitted from the second light source has a color deviation duv from the blackbody radiation locus in a range of −0.02 or more and 0.02 or less measured according to JIS Z8725, a light emission spectrum close to the visibility curve using the human visibility response can be obtained without the decrease of the light of the visibility component influencing the human visibility response. In the case where the light emitted from the second light source has a color deviation duv from the blackbody radiation locus in a range of −0.02 or more and 0.02 or less, the melanopic ratio can be controlled corresponding to the circadian rhythm with the mixed color light with the light emitted from the first light source influencing the melanopic ratio, and the mixed color light maintaining the light emission efficiency can be obtained. The second light source may emit light having a color deviation duv from the blackbody radiation locus in a range of −0.01 or more and 0.01 or less measured according to JIS Z8725 with a correlated color temperature in a range of 1,500 K or more and 8,000 K or less in the chromaticity diagram of the CIE 1931 color coordinate system.

The light emitting device preferably has an average color rendering index Ra of the mixed color light emitted from the light emitting device of 70 or more, and more preferably has an average color rendering index Ra of 75 or more, with a correlated color temperature in a range of 1,500 K or more and 8,000 K or less. The average color rendering index Ra of the light emitting device may be 100 or less. The average color rendering index Ra of the light emitting device may be measured according to JIS Z8726. With the average color rendering index Ra of the light emitting device that is closer to 100, a light emission color closer to the reference light source can be obtained. Since the first light source emits light containing the circadian component having a wavelength of from 480 nm to 490 nm, and the spectral distribution is close to the reference light source, the light emitting device can have a relatively high average color rendering index. In the case where a light source emitting light containing the circadian component having a wavelength of from 480 nm to 490 nm is used without the toning with the mixed color light of the light emitted from the first light source and the light emitted from the second light source, for example, in the case where light providing a correlated color temperature in a range of 4,000 K or more and 8,000 K or less is obtained by changing a fluorescent material in a single light source, the average color rendering index Ra may be slightly increased, but rather there is a tendency that the average color rendering index is decreased from the certain point as the base. This is because a single light source using only a light source emitting light containing a large amount of the circadian component having a wavelength of from 480 nm to 490 nm may break the color balance of the light emission spectrum obtained from the light emitting device. Furthermore, the visibility tends to deteriorate only with a light source emitting light containing a large amount of the circadian component having a wavelength of from 480 nm to 490 nm, which is difficult to apply to the general illumination purpose. According to the guidelines announced by CIE in 1986, the average color rendering index of a fluorescent lamp is 60 or more and less than 80 in factories for general operations. For enabling the effective control of the melanopic ratio corresponding to the toning for achieving the target color temperature, so as to provide the illumination considering the circadian rhythm, the mixed color light of the light emitted from the first light source and the light emitted from the second light source may have an average color rendering index Ra of 95 or less.

Figure 3:
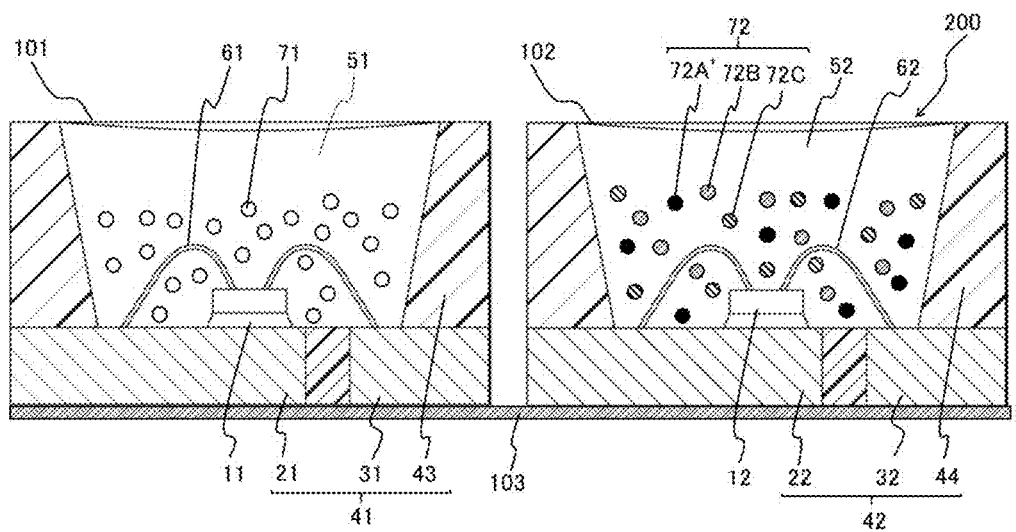
FIG. 3 is a schematic cross sectional view showing another example of a light emitting device.

The first light source 101 preferably has the first fluorescent material 71 that emits light through excitation by the first light emitting element 11. FIG. 3 is a schematic cross sectional view showing a light emitting device 200 of another embodiment of the present disclosure. The light emitting device 200 of another embodiment has the same structure as the light emitting device 100 except for the point that the first light source 101 has a fluorescent member 51 containing a first fluorescent material 71 instead of the covering member 50. The first light source 101 preferably has the fluorescent member 51 containing a first fluorescent material 71 that emits light through excitation by the first light emitting element 11 having a light emission peak wavelength in a range of 410 nm or more and 490 nm or less. The first light source 101 that has the first fluorescent material 71 can facilitate the control for emitting light in the particular light emission region LSa from the first light source 101, and thereby the mixed color light capable of controlling the melanopic ratio in consideration of the circadian rhythm while maintaining the target light emission efficiency can be readily obtained in toning the light emitted from the first light source and the light emitted from the second light source to emit light with the target correlated color temperature.

The first fluorescent material 71 contained in the first light source 101 is preferably a fluorescent material A containing at least one kind selected from the group consisting of the following fluorescent materials (A1), (A2), (A3), and (A4) each having a light emission peak wavelength in a range of 440 nm or more and 526 nm or less, and two or more kinds thereof may be contained. The first fluorescent material 71 contained in the first light source 101 more preferably contains at least a fluorescent material (A1) formed of an alkaline earth metal aluminate salt. In the case where the first fluorescent material 71 contained in the first light source 101 has a light emission peak wavelength in a range of 440 nm or more and 526 nm or less, the light emission intensity $I_{PM}$ can be suppressed from being decreased.

(A1) An alkaline earth metal aluminate salt fluorescent material activated with Eu, having a full width at half maximum in the light emission spectrum preferably in a range of 58 nm or more and 78 nm or less, and more preferably in a range of 63 nm or more and 73 nm or less (A2) A silicate salt fluorescent material activated with Eu, having a composition including at least one kind of an element selected from the group consisting of Ca, Sr, and Ba, Mg, and at least one kind of an element selected from the group consisting of F, Cl, and Br, having a full width at half maximum in the light emission spectrum preferably in a range of 50 nm or more and 75 nm or less, and more preferably in a range of 50 nm or more and 60 nm or less (A3) A silicate salt fluorescent material activated with Eu, having a composition including at least one kind of an element selected from the group consisting of Ba, Sr, and Ca, having a full width at half maximum in the light emission spectrum preferably in a range of 50 nm or more and 75 nm or less, and more preferably in a range of 58 nm or more and 68 nm or less (A4) A rare earth aluminate salt fluorescent material activated with Ce, having a composition including at least one kind of a rare earth element selected from the group consisting of Y, Gd, Tb, and Lu, Al, and depending on necessity Ga, having a full width at half maximum in the light emission spectrum preferably in a range of 90 nm or more and 115 nm or less, and more preferably in a range of 95 nm or more and 110 nm or less. The full width at half maximum (FWHM) means the wavelength width of the light emission peak at 50% of the maximum value of the light emission peak in the light emission spectrum of the fluorescent material.

In the case where the first light source 101 contains a fluorescent material selected from the group consisting of the following fluorescent materials (A1), (A2), (A3), and (A4) as the first fluorescent material 71, mixed color light capable of controlling the melanopic ratio in consideration of the circadian rhythm while maintaining the target light emission efficiency, having a chromaticity of the mixed color light close to the blackbody radiation locus with a color deviation duv in a range of −0.02 or more and 0.02 or less in toning to emit light with the target correlated color temperature with the light emitted from the first light source and the light emitted from the second light source can be obtained from the light emitting device. For example, with a low correlated color temperature, e.g., a correlated color temperature over around 3,000 K to around 2,700 K, i.e., light close to sunlight in the evening to the sunset, mixed color light having a light emission spectrum having a low melanopic ratio is preferably obtained for facilitating the secretion of melatonin. On the other hand, with a correlated color temperature of more than 3,000 K and around 6,500 K, i.e., light close to sunlight during morning to noon, mixed color light having a light emission spectrum having a high melanopic ratio stimulating the circadian rhythm is preferably obtained for suppressing the secretion of melatonin.

The first fluorescent material 71 contained in the first light source 101 is more preferably at least one kind of a fluorescent material selected from the group consisting of fluorescent materials having the compositions represented by the following formulae (a1), (a2), (a3), and (a4), and two or more kinds thereof may be used in combination. In the case where the first light source 101 contains at least one kind of a fluorescent material selected from the group consisting of fluorescent materials having the compositions represented by the following formulae (a1), (a2), (a3), and (a4) as the fluorescent material 71, light having a large amount of the circadian component having a wavelength of from 480 nm to 490 nm can be obtained, and mixed color light having an average color rendering index Ra of 70 or more can be obtained with the light emitted from the first light source 101 and the light emitted from the second light source 102.

$$Sr_4Al_{14}O_{25}:Eu \quad (a1)$$

$$(Ca,Sr,Ba)_8MgSi_4O_{16}(F,Cl,Br)_2:Eu \quad (a2)$$

$$(Ca,Sr,Ba)_2SiO_4:Eu \quad (a3)$$

$$(Y,Gd,Tb,Lu)_3(Al,Ga)_5O_{12}:Ce \quad (a4)$$

In the compositions showing the fluorescent materials herein, the plural elements delimited by a comma (,) means that at least one kind of the plural elements is contained in the composition, and a combination of two or more kinds of the plural elements may be contained. In the compositions showing the fluorescent materials in the description herein, the term before the colon (:) shows the elements constituting the base crystal and the molar ratios thereof, and the term after the colon (:) shows the activation element. The term "molar ratio" means the molar amount of the element in one mol of the composition of the fluorescent material.

The amount of the first fluorescent material 71 contained in the first light source 101 may vary depending on the wavelength range of the second light emitting element 12 of the second light source 102 combined with the first light source 101, the kind of the second fluorescent material 72, and the size of the light emitting device 200. It suffices that the amount of the first fluorescent material 71 contained in the first light source 101 is such an amount that the light emitted from the first light source 101 is in the light emission region LSa of the first light source, and in the light emission spectrum of the light emitting device 200, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 is in a range of 0.22 or more and 0.95 or less.

The second fluorescent material 72 contained in the second light source 102 preferably contains at least one kind selected from a second fluorescent material 72B having a light emission peak wavelength in a range of 601 nm or more and less than 650 nm and a second fluorescent material 72C having a light emission peak wavelength in a range of 650 nm or more and 670 nm or less, and a second fluorescent material 72A' having a light emission peak wavelength in a range of 440 nm or more and 600 nm or less. The second fluorescent material 72 may contain the second fluorescent material 72A' and two or more kinds selected from the group consisting of the second fluorescent material 72B and the second fluorescent material 72C, which have wavelength ranges of the light emission peak wavelength different from each other, and may contain three kinds of the fluorescent materials. In the case where the fluorescent materials are contained in the second light source 102 in this manner, white color light having been toned to have the target correlated color temperature can be emitted from the second light source 102, and mixed color light capable of controlling the melanopic ratio in consideration of the circadian rhythm can be obtained with the light emitted from the second light source 102 and the light emitted from the first light source 101 while maintaining the target light emission efficiency.

In the second fluorescent material 72, the second fluorescent material 72A' having a light emission peak wavelength in a range of 440 nm or more and 600 nm or less preferably contains at least one kind selected from the group consisting of the following fluorescent materials (A1), (A2), (A3), and (A4), and two or more kinds of the fluorescent materials may be contained. In the second fluorescent material 72, the second fluorescent material 72A' having a light emission peak wavelength in a range of 440 nm or more and 600 nm or less may contain at least one kind of a fluorescent material selected from the group consisting of fluorescent materials of the same kind as the first fluorescent material 71 contained in the first light source 101. The second fluorescent material 72A' having a light emission peak wavelength in a range of 440 nm or more and 600 nm or less may be a fluorescent material of the same kind as the first fluorescent material 71 or may be a fluorescent material of a different kind from the first fluorescent material 71.

(A1) An alkaline earth metal aluminate salt fluorescent material activated with Eu, having a full width at half maximum in the light emission spectrum preferably in a range of 58 nm or more and 78 nm or less, and more preferably in a range of 63 nm or more and 73 nm or less
(A2) A silicate salt fluorescent material activated with Eu, having a composition including at least one kind of an element selected from the group consisting of Ca, Sr, and Ba, Mg, and at least one kind of an element selected from the group consisting of F, Cl, and Br, having a full width at half maximum in the light emission spectrum preferably in a range of 50 nm or more and 75 nm or less, and more preferably in a range of 50 nm or more and 60 nm or less
(A3) A silicate salt fluorescent material activated with Eu, having a composition including at least one kind of an element selected from the group consisting of Ba, Sr, and Ca, having a full width at half maximum in the light emission spectrum preferably in a range of 50 nm or more and 75 nm or less, and more preferably in a range of 58 nm or more and 68 nm or less
(A4) A rare earth aluminate salt fluorescent material activated with Ce, having a composition including at least one kind of a rare earth element selected from the group consisting of Y, Gd, Tb, and Lu, Al, and depending on necessity Ga, having a full width at half maximum in the light emission spectrum preferably in a range of 90 nm or more and 115 nm or less, and more preferably in a range of 95 nm or more and 110 nm or less In the second fluorescent material 72, the second fluorescent material 72B having a light emission peak wavelength in a range of 601 nm or more and less than 650 nm is preferably at least one kind selected from the group consisting of the following fluorescent materials (B1), (B2), and (B3), and two or more kinds of the fluorescent materials may be contained.
(B1) A silicon nitride fluorescent material activated with Eu, having a composition including at least one kind of an element selected from the group consisting of Sr and Ca, and Al, having a full width at half maximum in the light emission spectrum preferably in a range of 65 nm or more and 100 nm or less, and more preferably in a range of 70 nm or more and 95 nm or less
(B2) An alkaline earth metal silicon nitride fluorescent material activated with Eu, having a full width at half maximum in the light emission spectrum preferably in a range of 80 nm or more and 100 nm or less, and more preferably in a range of 85 nm or more and 95 nm or less
(B3) A fluoride fluorescent material activated with Mn, having a full width at half maximum in the light emission spectrum of preferably 10 nm or less, and generally 1 nm or more In the second fluorescent material 72, the second fluorescent material 72C having a light emission peak wavelength in a range of 650 nm or more and 680 nm or less is preferably at least one kind selected from the group consisting of the following fluorescent materials (C1) and (C2), and two or more kinds of the fluorescent materials may be contained.
(C1) A fluorogermanate fluorescent material activated with Mn, having a full width at half maximum in the light emission spectrum of preferably 45 nm or less, more preferably 40 nm or less, and generally 1 nm or more
(C2) An alkali nitride fluorescent material activated with Eu, having a composition including at least one kind of an element selected from the group consisting of Ca, Sr, Ba, and Mg, at least one kind of an element selected from the group consisting of Li, Na, and K, and Al, having a full width at half maximum in the light emission spectrum preferably in a range of 40 nm or more and 70 nm or less, and more preferably in a range of 45 nm or more and 65 nm or less It is preferred that the second fluorescent material 72 contains the second fluorescent material 72A' and at least one kind selected from the second fluorescent material 72B and the second fluorescent material 72C, and the second fluorescent material 72A' is at least one kind selected from the group consisting of an alkaline earth metal aluminate salt fluorescent material having a composition represented by the following formula (a1), a silicate salt fluorescent material having a composition represented by the following formula (a2), a silicate salt fluorescent material having a composition represented by the following formula (a3), and a rare earth aluminate salt fluorescent material having a composition represented by the following formula (a4), and two or more kinds thereof may be contained.

$$Sr_4Al_{14}O_{25}:Eu \quad (a1)$$

$$(Ca,Sr,Ba)_8MgSi_4O_{16}(F,Cl,Br)_2:Eu \quad (a2)$$

$$(Ca,Sr,Ba)_2SiO_4:Eu \quad (a3)$$

$$(Y,Gd,Tb,Lu)_3(Al,Ga)_5O_{12}:Ce \quad (a4)$$

It is preferred that the second fluorescent material 72B is at least one kind selected from the group consisting of a silicon nitride fluorescent material having a composition represented by the following formula (b1), an alkaline earth metal silicon nitride fluorescent material having a composition represented by the following formula (b2), and a fluoride fluorescent material having a composition represented by the following formula (b3), and two or more kinds thereof may be contained.

$$(Ca,Sr)AlSiN_3:Eu \quad (b1)$$

$$(Ca,Sr,Ba)_2Si_5N_8:Eu \quad (b2)$$

$$K_2(Si,Ge,Ti)F_6:Mn \quad (b3)$$

It is preferred that the second fluorescent material 72C is at least one kind selected from the group consisting of a fluorogermanate fluorescent material having a composition represented by the following formula (c1) and an alkali nitride fluorescent material having a composition represented by the following formula (c2), and two or more kinds thereof may be contained.

$$3.5MgO \cdot 0.5MgF_2 \cdot GeO_2:Mn \quad (c1)$$

$$(Sr,Ca)(Li,Na,K)Al_3N_4:Eu \quad (c2)$$

The amount of the second fluorescent material 72 contained in the second light source 102 may vary depending on the kind of the first light emitting element 11 of the first light source 101 used in combination, the kind of the first fluorescent material 71, and the size of the light emitting device 100 or 200. It suffices that the amount of the second fluorescent material 72 contained in the second light source 102 is such an amount that the light emitted from the second light source 102 has a color deviation duv from the blackbody radiation locus in a range of −0.02 or more and 0.02 or less measured according to JIS Z8725 with a correlated color temperature in a range of 1,500 K or more and 8,000 K or less.

The first fluorescent material 71 contained in the first light source 101 and the second fluorescent material 72 contained in the second light source 102 may be contained in the fluorescent members 51 and 52 respectively. The fluorescent members 51 and 52 preferably contain the first fluorescent member 71 and the second fluorescent member 72 respectively and a sealing material. The sealing material contained in the covering member 50, the fluorescent member 51, and the fluorescent member 52 may be a resin selected from a thermoplastic resin and a thermosetting resin. Examples of the resin used as the sealing member include a silicone resin and an epoxy resin from the standpoint of the easiness in production. The covering member 50, the fluorescent member 51, and the fluorescent member 52 may contain such components as a filler, a light stabilizer, and a colorant, in addition to the first fluorescent material or the second fluorescent material, and the sealing material. Examples of the filler include silica, barium titanate, titanium oxide, and aluminum oxide. The content of the components in the covering member 50, the fluorescent member 51, and the fluorescent member 52 except for the first fluorescent material, the second fluorescent material, and the sealing material may vary depending on the size of the target light emitting device, the correlated color temperature of the target mixed color light, the color deviation duv of the mixed color light, and the color tone of the mixed color light, and may be set to a preferred range based on the target correlated color temperature, color deviation duv, and color tone. For example, the content of the components in the covering member 50, the fluorescent member 51, and the fluorescent member 52 except for the fluorescent materials and the sealing material may be in a range of 0.01 part by mass or more and 20 parts by mass or less per 100 parts by mass of the sealing material.

The light emitting device 100 or 200 may have plural first light sources 101 and plural second light sources 102. The light emitting device 100 or 200 preferably includes a driving device including: a driving circuit that enables a setting part capable of setting the target color tone to operate together with a controlling part capable of controlling the light output of the first light source 101 and the light output of the second light source 102 independently to tone the color temperature to the target temperature; and a power source receiving external electric power. As the light emitting device having the driving device, a known measure, such as the measure described in Japanese Unexamined Patent Publication No. 2012-113959 A, may be employed. With the driving device capable of controlling the light output of the first light source 101 and the light output of the second light source 102 independently, the light emitting device 100 or 200 can emit mixed color light having the target color temperature of from a low color temperature to a high color temperature and the target chromaticity.

EXAMPLES

The present disclosure will be described more specifically with reference to examples below. The present disclosure is not limited to the examples.

Example 1

A light emitting device having the same structure as the light emitting device 200 shown in FIG. 3 was produced.

Example 1: First Light Emitting Element 11 and Second Light Emitting Element 12

As the first light emitting element 11 in the first light source 101 and the second light emitting element 12 in the second light source 102 of the light emitting device 200, a nitride semiconductor having a light emission peak wavelength of 446 nm was used. For the light emission peak wavelengths of the first light emitting element 11 and the second light emitting element 12, the light emission spectrum was measured with an omnidirectional integrating sphere, and the wavelength exhibiting the highest light emission intensity in the light emission spectrum was designated as the light emission peak wavelength.

Example 1: Sealing Material Used in Fluorescent Members 51 and 52

As the sealing material of the fluorescent member 51 in the first light source 101 and the fluorescent member 52 in the second light source 102, a silicone resin was used.

Example 1: First Fluorescent Material 71

As the first fluorescent material 71 contained in the first light source 101, (A1) an alkaline earth metal aluminate fluorescent material having a light emission peak wavelength of 495 nm through excitation with the light emitted from the first light emitting element 11, having a composition represented by $Sr_4Al_{14}O_{25}$:Eu, and having a full width at half maximum of 68 nm (which may be hereinafter referred to as an "SAE fluorescent material") was used. The amount of the first fluorescent material 71 contained in the first light source 101 was such an amount that the light emitted from the first light source 101 had x of 0.149 (x=0.149) and y of 0.234 (y=0.234) in the chromaticity diagram of the CIE 1931 color coordinate system. The amount of the first fluorescent material 71 contained in the first light source 101 was such an amount that in the light emission spectrum of the light emitting device 200, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 is in a range of 0.22 or more and 0.95 or less.

Example 1: Second Fluorescent Material 72

As the second fluorescent material 72 contained in the second light source 102, two kinds of fluorescent materials were used as the second fluorescent material A', and one kind of a fluorescent material was used as the second fluorescent material B, as described below. As the second fluorescent material A', (A4-1) a rare earth aluminate fluorescent material having a light emission peak wavelength of 533 nm through excitation with the light emitted from the second light emitting element 12, having a composition represented by $Y_3Al_5O_{12}$:Ce, and having a full width at half maximum of 108 nm (which may be hereinafter referred to as a "YAG fluorescent material"), and (A4-2) a rare earth aluminate salt fluorescent material having a light emission peak wavelength of 538 nm through excitation with the light emitted from the second light emitting element 12, having a composition represented by $Lu_3Al_5O_{12}$:Ce, and having a full width at half maximum of 105 nm (which may be hereinafter referred to as an "LAG fluorescent material") were used. As the second fluorescent material B, (B1) a silicon nitride fluorescent material having a light emission peak wavelength of 630 nm through excitation with the light emitted from the second light emitting element 12, having a composition represented by (Sr,Ca)$AlSiN_3$:Eu, and having a full width at half maximum of 81 nm (which may be hereinafter referred to as an "SCASN fluorescent material") was used. The amount of the second fluorescent material 72 used was such an amount that the light emitted from the second light source 102 had a correlated color temperature of around 2,700 K and a color deviation duv from the blackbody radiation locus measured according to JIS Z8725 of around 0 or duv in a range of −0.02 or more and 0.02 or less, and the mixed color light of the light emitted from the first light source 101 and the light emitted from the second light source 102 had an average color rendering index Ra of 75 or more.

Example 1: First Light Source 101

The silicone resin as the sealing material and the first fluorescent material 71 were mixed to disperse the first fluorescent material 71 in the silicone resin, so as to provide a resin composition for the fluorescent member. The resin composition was charged in the concave portion of the molded article 41 constituting the first light source 101, and the resin composition was cured by heating to 150° C. for 3 hours to form the fluorescent member 51, thereby producing the first light source 101. For the first light source, the chromaticity coordinate (chromaticity x,y) of the light emission color was measured with an optical measurement system having a combination of a multi-channel spectroscope and an integral sphere.

Example 1: Second Light Source 102

The silicone resin as the sealing material and the second fluorescent material 72 were mixed to disperse the second fluorescent material 72 in the silicone resin, so as to provide a resin composition for the fluorescent member. The resin composition was charged in the concave portion of the molded article 42 constituting the second light source 102, and the resin composition was cured by heating to 150° C. for 3 hours to form the fluorescent member 52, thereby producing the second light source 102. For the second light source, the chromaticity coordinate (chromaticity x,y) of the light emission color, the correlated color temperature (Tcp; K) according to JIS Z8725, the color deviation duv from the blackbody radiation locus, and the average color rendering index Ha according to JIS Z8726 were measured with an optical measurement system having a combination of a multi-channel spectroscope and an integral sphere.

Example 1: Light Emitting Device 200

The light emitting device 200 was produced by using the first light source 101 and the second light source 102 obtained above. The light emitting device 200 included plural first light sources 101 and plural second light sources 102, so as to provide mixed color light of around 3,000 K, around 4,000 K, around 5,000 K, or around 6,500 K through the control of the light output of the first light sources 101 and the control of the light output of the second light sources 102. In the light emitting device 200, the controlling part capable of controlling the light output of the first light sources 101 and the light output of the second light sources 102, so a to tone to provide the target color temperature, and the setting part capable of setting the target color tone can be coordinated to each other, and can emit mixed color light having the target color temperature and chromaticity through the control of the light output of the first light sources 101 and the control of the light output of the second light sources 102.

Evaluation
Light Emission Spectrum (Spectral Distribution) and Light Intensity Ratio The light emission spectra (spectral distributions) of the mixed color light emitted from the light emitting devices of Examples and Comparative Examples were measured with a spectrofluorophotometer (F-4500, manufactured by Hitachi High-Technologies Corporation). In the light emission spectrum of the light emitting device, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 was obtained. The light emission intensity $I_{PM}$ shows the light emission intensity at 490 nm, which is the maximum light emission peak wavelength of the circadian response curve using the response of melanopsin as the ipRGC (i.e., the melanopic light emission intensity). The light emission intensity $I_{PL}$ shows the light emission intensity at the maximum light emission peak wavelength of the excitation light source. The light emission intensity ratio $I_{PM}/I_{PL}$ shows the melanopic light emission intensity $I_{PM}$ with respect to the light emission intensity $I_{PL}$ of the excitation light source.

Light Emission Efficiency (lm/W), Chromaticity (x,y), Correlated Color Temperature, and Average Color Rendering Index Ra For each of the light emitting devices of Examples and Comparative Examples, the light emission efficiency (lm/W) obtained by dividing the total luminous flux (lm) obtained from the light source by the electric energy applied, the chromaticity coordinate (chromaticity x,y) of the light emission color, the correlated color temperature (Tcp; K) according to JIS Z8725, and the color rendering index Ra and the special color rendering indices R9 and R12 according to JIS Z8726 were measured with an optical measurement system having a combination of a multi-channel spectroscope and an integral sphere. The special color rendering indices R9 and R12 are color rendering indices for evaluating red color and blue color respectively. The electric current applied in the measurement of the light emitting device was 65 mA for the rated forward current of the light emitting device, and the forward voltage at this time was 2.89 V.

Melanopic Ratio

For evaluating the extent of the stimulation quantity influencing the circadian rhythm by the mixed color light emitted from each of the light emitting devices of Examples and Comparative Examples, the melanopic ratio was obtained from the resulting light emission spectrum by the following expression (2). Assuming that the melanopic ratios of the light emitted from the light emitting device of Comparative Example 1 at the correlated color temperatures each were 100%, the melanopic ratios of Examples and Comparative Examples except for Comparative Example 1 each were expressed as a relative melanopic ratio.

$$\text{Melanopic ratio} = \frac{\sum_{730}^{380} \text{Lamp} \times \text{Circadian}}{\sum_{730}^{380} \text{Lamp} \times \text{Visual}} \times 1.218 \qquad (2)$$

In the expression (2), (Lamp×Circadian) is the circadian response contained in the spectral distribution of the light source, (Lamp×Visual) is the visibility response contained in the spectral distribution of the light source, and 1.218 is the constant (lux factor). In the expression (2), the term "Lamp" shows the spectral distribution of the light source. In the expression (2), the term "Circadian" shows the sensitivity curve (absorbance) of ipRGC, which is a light receptor on the retina of mammals. In the expression (2), the term "Visual" shows the visibility curve in the human photopic vision.

Melanopic Light Emission Efficiency

For evaluating the extent of the influence of the mixed color light emitted from each of the light emitting devices of Examples and Comparative Examples on the circadian rhythm per unit electric power consumption, the melanopic light emission efficiency obtained as a product of the melanopic ratio and the light emission efficiency (lm/W) shown by the following expression (3) was obtained. Assuming that the melanopic light emission efficiencies of the light emitted from the light emitting device of Comparative Example 1 at the correlated color temperatures each were 100%, the melanopic light emission efficiencies of Examples and Comparative Examples except for Comparative Example 1 each were expressed as a relative melanopic light emission efficiency.

(melanopic light emission efficiency)=(melanopic ratio)×(light emission efficiency (lm/W))  (3)

Table 1 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 1. Table 2 shows the evaluation results of the light emitting device of Example 1.

TABLE 1

| | Example 1 | |
|---|---|---|
| | First light source | Second light source |
| Color temperature | 212406 K | 2720 K |
| Light emitting element | 446 nm nitride semiconductor | 446 nm nitride semiconductor |
| Fluorescent material | A1: 495 nm $Sr_5Al_{14}O_{25}$:Eu (SAE) | A4-1: 533 nm $Y_3Al_5O_{12}$:Ce (YAG) |
| | — | A4-2: 538 nm $Lu_3Al_5O_{12}$:Ce (LAG) |
| | — | B1: 630 nm (Sr, Ca)$AlSiN_3$:Eu (SCASN) |
| Chromaticity x | 0.149 | 0.458 |
| Chromaticity y | 0.234 | 0.410 |
| duv | — | 0.00 |
| Ra | — | 82.0 |

In the light emitting device of Example 1, in the case where the color temperature of the mixed color light obtained by toning the light emitted from the first light source and the light emitted from the second light source was around 3,000 K, around 4,000 K, around 5,000 K, and around 6,500 K, the relative melanopic ratio was increased by from 9% to 35%, and the relative melanopic light emission efficiency was increased by from 5% to 16%, according to the increase of the color temperature, as compared to the light emitting device of Comparative Example 1. It was understood from the result that in the case where the correlated color temperature was from 3,000 K to 6,500 K, i.e., a correlated color temperature close to that of sunlight during morning to noon, the melanopic ratio could be controlled to a high value for stimulating the circadian rhythm for suppressing the secretion of melatonin. Furthermore, the mixed color light emitted from the light emitting device of Example 1 had a high light emission intensity ratio $I_{PM}/I_{PL}$ of 0.79, and contained a large amount of the circadian component having a wavelength of from 480 nm to 490 nm influencing the melanopic ratio. In the light emitting device of Example 1, in the case where the color temperature was toned to around 2,700 K to around 6,500 K, i.e., a color temperature during morning to noon, the values of the average color rendering index Ra, the special color rendering index R9, and the special color rendering index R12 were increased, and thus color rendering capability sufficient for the visual environment for the human general operation was achieved. In particular, at around 3,000 K, around 4,000 K, around 5,000 K, and around 6,500 K, the mixed color light emitted from the light emitting device of Example 1 had an average color rendering index Ra of 85 or more, and mixed color light that was particularly suitable for the environmental light for humans performing production activities during the day, such as studies, reading, and general operations, was obtained. For example, at around 5,000 K and around 6,500 K, the light emission spectrum of the sunlight was used as the reference light source, and it was confirmed that the light emitting device of Example 1 provided the mixed color light close to sunlight, and thus was suitable as the illumination considering the circadian rhythm.

Figure 4:
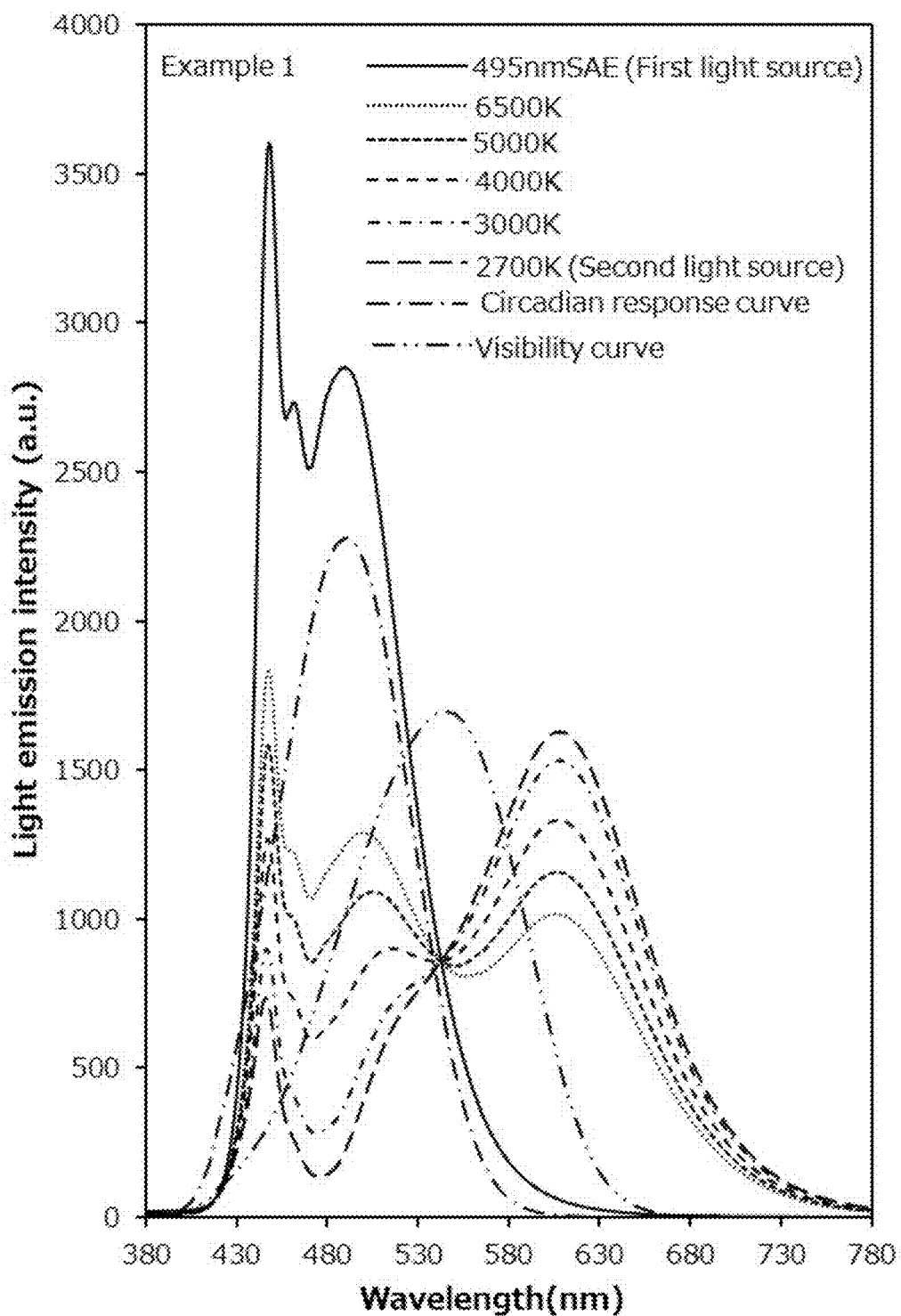
FIG. 4 is a diagram showing the light emission spectra of mixed color light emitted from the light emitting device of Example 1 at correlated color temperatures of 6,500 K, 5,000 K, 4,000 K, 3,000 K, and 2,700 K, the light emission spectrum of only the first light source thereof, the circadian response curve, and the visibility curve.

FIG. 4 is a diagram showing the light emission spectra of mixed color light emitted from the light emitting device of Example 1 at correlated color temperatures of around 2,700 K, around 3,000 K, around 4,000 K, around 5,000 K, and around 6,500 K, the light emission spectrum of only the first

TABLE 2

| | | | | | | | | | | Relative melanopic light emission efficiency | Light emission intensity ratio |
|---|---|---|---|---|---|---|---|---|---|---|---|
| Set correlated color temperature | Correlated color temperature | Color deviation | Light emission efficiency | Chromaticity | | Color rendering index | | | Relative melanopic ratio | | |
| Tcp (K) | Tcp (K) | duv | (lm/W) | x | y | Ra | R9 | R12 | | | $I_{PM}/I_{PL}$ |
| 2700 | 2720 | 0.00 | 158 | 0.458 | 0.410 | 82.0 | 13.1 | 67.7 | 100 | 100 | — |
| Second light source | | | | | | | | | | | |
| 3000 | 2993 | −0.01 | 157 | 0.433 | 0.396 | 86.5 | 24.5 | 82.7 | 109 | 105 | — |
| 4000 | 3847 | 0.00 | 154 | 0.383 | 0.368 | 93.4 | 59.1 | 89.2 | 123 | 111 | — |
| 5000 | 5010 | 0.00 | 151 | 0.344 | 0.345 | 91.5 | 82.6 | 85.1 | 132 | 115 | — |
| 6500 | 6423 | 0.00 | 149 | 0.314 | 0.328 | 89.7 | 95.5 | 83.8 | 135 | 116 | — |
| First light source | 212406 | — | 121 | 0.149 | 0.234 | 0.0 | 0.0 | 0.0 | — | — | 0.79 | light source thereof, the circadian response curve, and the visibility curve. In the light emission spectra of the light emitting device of Example 1, the mixed color light toned to increase the correlated color temperature of from around 2,700 K to around 6,500 K had an increased amount of the circadian component having a wavelength of from 480 nm to 490 nm. Accordingly, the light emitting device of Example 1 could be controlled to have a higher melanopic ratio for stimulating the circadian rhythm.

Example 2

A light emitting device 200 was produced in the same manner as in Example 1 except that (A4) a YAG fluorescent material having a light emission peak wavelength at 557 nm and a full width at half maximum of 111 nm and (B1) an SCASN fluorescent material having a light emission peak wavelength at 620 nm and a full width at half maximum of 75 nm were used as the second fluorescent material 72 used in the second light source 102.

Table 3 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 2. Table 4 shows the evaluation results of the light emitting device of Example 2.

In the light emitting device of Example 2, in the case where the color temperature of the mixed color light obtained by toning the light emitted from the first light source and the light emitted from the second light source was around 4,000 K, around 5,000 K, and around 6,500 K, the relative melanopic ratio was increased by from 15% to 31%, and the relative melanopic light emission efficiency was increased by from 14% to 20%, according to the increase of the color temperature, as compared to the light emitting device of Comparative Example 1. It was understood from the result that in the case where the correlated color temperature was from 4,000 K to 6,500 K, i.e., a correlated color temperature close to that of sunlight during morning to noon, the melanopic ratio could be controlled to a high value for stimulating the circadian rhythm for suppressing the secretion of melatonin. The mixed color light obtained from the light emitting device of Example 2 provided a light emission spectrum having a low value of the melanopic ratio facilitating the secretion of melatonin promoting sleep at a correlated color temperature of from around 3,000 K to around 2,700 K, close to that of sunlight during evening to sunset, and thus was suitable as the illumination considering the circadian rhythm. Furthermore, the mixed color light emitted from the light emitting device of Example 2 had a high light emission intensity ratio $I_{PM}/I_{PL}$ of 0.79, and contained a large amount of the circadian component having a wavelength of from 480 nm to 490 nm influencing the melanopic ratio. In the light emitting device of Example 2, in the case where the color temperature was toned to around 2,700 K to around 6,500 K, i.e., a color temperature during morning to noon, the values of the average color rendering index Ra, the special color rendering index R9, and the special color rendering index R12 were increased, and thus color rendering capability sufficient for the visual environment for the human general operation was achieved.

Figure 5:
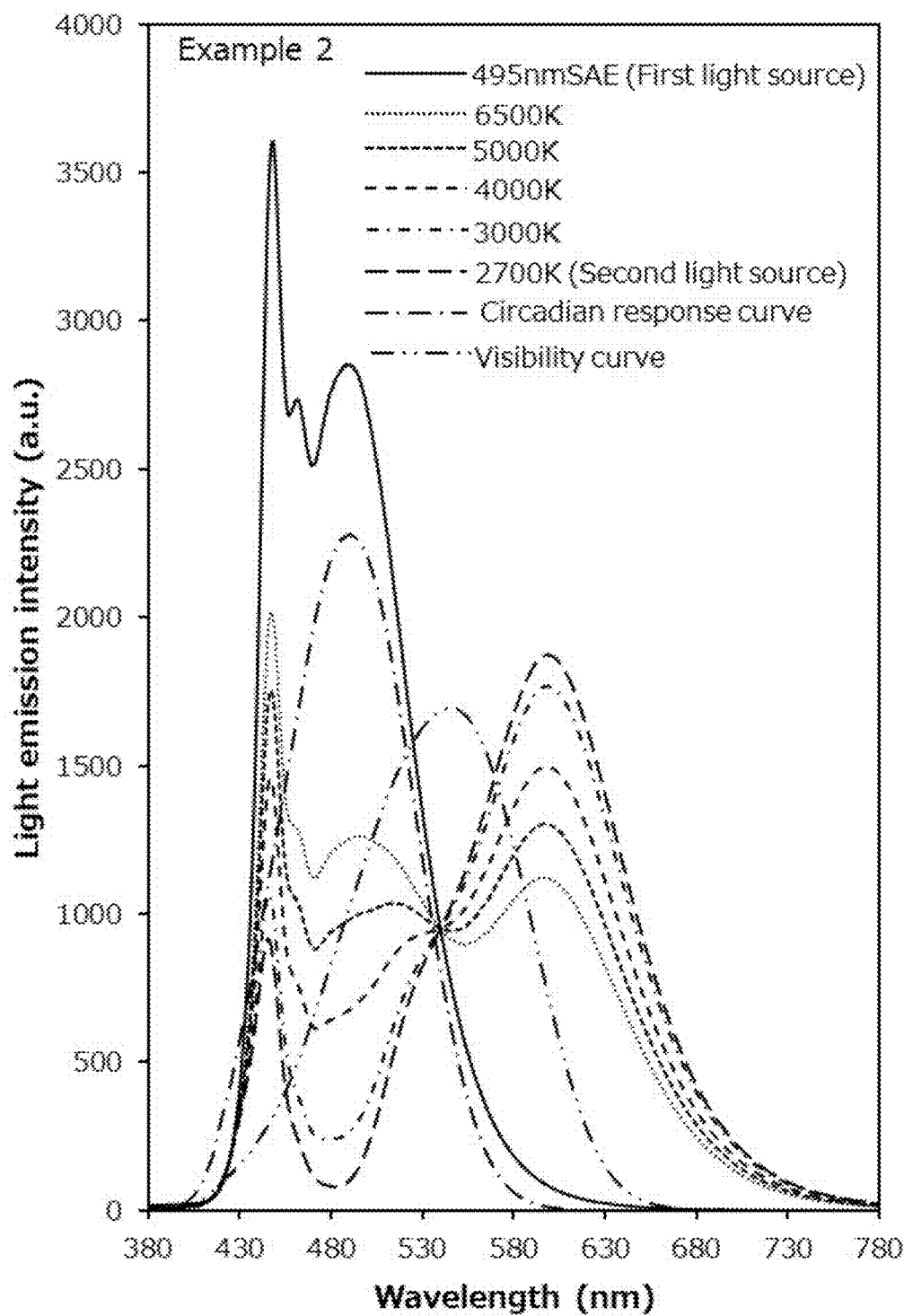
FIG. 5 is a diagram showing the light emission spectra of mixed color light emitted from the light emitting device of Example 2 at correlated color temperatures of 6,500 K, 5,000 K, 4,000 K, 3,000 K, and 2,700 K, the light emission spectrum of only the first light source thereof, the circadian response curve, and the visibility curve.

FIG. 5 is a diagram showing the light emission spectra of the light emitting device of Example 2 at correlated color temperatures of around 2,700 K, around 3,000 K, around 4,000 K, around 5,000 K, and around 6,500 K, the light emission spectrum of only the first light source thereof, the circadian response curve, and the visibility curve. In the light emission spectra of the light emitting device of Example 2, the mixed color light toned to increase the correlated color temperature of from around 2,700 K to around 6,500 K had an increased amount of the circadian component having a wavelength of from 480 nm to 490 nm.

TABLE 3

| | Example 2 | |
|---|---|---|
| | First light source | Second light source |
| Color temperature | 212406 K | 2715 K |
| Light emitting element | 446 nm nitride semiconductor | 446 nm nitride semiconductor |
| Fluorescent material | A1: 495 nm $Sr_4Al_{14}O_{25}$:Eu (SAE) | A4: 557 nm $Y_3Al_5O_{12}$:Ce (YAG) |
| | — | B1: 620 nm (Sr, Ca)AlSiN$_3$:Eu (SCASN) |
| | — | — |
| | — | — |
| Chromaticity x | 0.149 | 0.458 |
| Chromaticity y | 0.234 | 0.410 |
| duv | — | 0.00 |
| Ra | — | 70.4 |

TABLE 4

| | | | | | | | | | | | |
|---|---|---|---|---|---|---|---|---|---|---|---|
| | | | | Example 2 | | | | | | | |
| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
| Tcp (K) | Tcp (K) | duv | (lm/W) | x | y | Ra | R9 | R12 | ratio | efficiency | $I_{PM}/I_{PL}$ |
| 2700 Second light source | 2715 | 0.00 | 177 | 0.458 | 0.410 | 70.4 | −29.7 | 42.6 | 85 | 95 | — |
| 3000 | 2956 | 0.00 | 176 | 0.436 | 0.397 | 75.4 | −19.1 | 60.1 | 94 | 101 | — |
| 4000 | 3850 | −0.01 | 170 | 0.383 | 0.367 | 86.8 | 18.2 | 83.2 | 115 | 114 | — |
| 5000 | 4938 | 0.00 | 165 | 0.346 | 0.346 | 91.2 | 43.1 | 83.9 | 124 | 117 | — |
| 6500 | 6446 | 0.00 | 159 | 0.314 | 0.328 | 91.5 | 60.9 | 86.2 | 131 | 120 | — |
| First light source | 212406 | — | 121 | 0.149 | 0.234 | 0.0 | 0.0 | 0.0 | — | — | 0.79 |

Accordingly, the light emitting device of Example 2 could be controlled to have a higher melanopic ratio for stimulating the circadian rhythm.

Comparative Example 1

A light emitting device was produced by using two second light sources 102 including one second light source 102 set to have a correlated color temperature of around 2,700 K as similar to Example 1 (which may be hereinafter referred to as a "2,700 K second light source") and another second light source 102 set to have a correlated color temperature of around 6,500 K (which may be hereinafter referred to as a "6,500 K second light source"), without the use of the first light source 101.

Comparative Example 1: 6,500 K Second Light Source 102

The 6,500 K second light source 102 used a nitride semiconductor having a light emission peak wavelength of 446 nm as the second light emitting element 12. A silicone resin was used as the sealing material of the fluorescent member 52. In the second fluorescent material 72 contained in the 6,500 K second light source 102, as the second fluorescent material A', two kinds of fluorescent materials, i.e., (A4-1) a YAG fluorescent material having a light emission peak wavelength of 533 nm and a full width at half maximum of 108 nm and (A4-2) an LAG fluorescent material having a light emission peak wavelength of 538 nm and a full width at half maximum of 105 nm, were used, and as the second fluorescent material B, (B1) an SCASN fluorescent material having a light emission peak wavelength of 630 nm and a full width at half maximum of 63 nm was used. The amount of the second fluorescent material 72 used was such an amount that the light emitted from the second light source 102 had a correlated color temperature of around 6,500 K and a color deviation duv measured according to JIS Z8725 of around 0, and the mixed color light of the light emitted from the 2,700 K second light source 102 and the light emitted from the 6,500 K second light source 102 had an average color rendering index Ra of 85 or more.

Comparative Example 1: Light Emitting Device

The light emitting device was produced by using two second light sources, i.e., the 2,700 K second light source 102 and the 6,500 K second light source 102 obtained above. The light emitting device included plural 2,700 K second light sources 102 and plural 6,500 K second light sources 102, so as to provide mixed color light of around 3,000 K, around 4,000 K, around 5,000 K, or around 6,500 K through the control of the light output of the 2,700 K second light sources 102 and the control of the light output of the 6,500 K second light sources 102. In the light emitting device, the controlling part capable of controlling the light output of the 2,700 K second light sources 102 and the light output of the 6,500 K second light sources 102, so a to tone to provide the target color temperature, and the setting part capable of setting the target color tone can be coordinated to each other, and can emit mixed color light having the target color temperature and chromaticity through the control of the light output of the 2,700 K second light sources 102 and the control of the light output of the 6,500 K second light sources 102. In the light emitting device, the 2,700 K second light source 102 set to a low correlated color temperature of around 2,700 K can emit light having a low correlated color temperature of 2,700 K, and the 6,500 K second light source 102 can emit light having a high correlated color temperature of around 6,500 K, and the light emitting device can emit mixed color light having a color deviation duv in a range of −0.02 or more and 0.02 or less, from the blackbody radiation locus over a low color temperature to a high color temperature, through the control of the light output of the 2,700 K second light sources 102 and the control of the light output of the 6,500 K second light sources 102.

Table 5 shows the set color temperatures, the light emitting elements, the first fluorescent material or the second fluorescent material, the coordinates x and y in the chromaticity diagram of the CIE 1931 color coordinate system, the color deviations, and the average color rendering indices of the 2,700 K second light source and the 6,500 K second light source of the light emitting device of Comparative Example 1. Table 6 shows the evaluation results of the light emitting device of Comparative Example 1.

TABLE 5

| | Comparative Example 1 | | |
|---|---|---|---|
| | First light source | Second light source | |
| Color temperature | — | 6514 K | 2720 K |
| Light emitting element | — | 446 nm nitride semiconductor | 446 nm nitride semiconductor |
| Fluorescent material | — | A4-1: 533 nm $Y_3Al_5O_{12}$:Ce (YAG) | A4-1: 533 nm $Y_3Al_5O_{12}$:Ce (YAG) |
| | — | A4-2: 538 nm $Lu_3Al_5O_{12}$:Ce (LAG) | A4-2: 538 nm $Lu_3Al_5O_{12}$:Ce (LAG) |
| | — | B1: 630 nm (Sr, Ca)$AlSiN_3$:Eu (SCASN) | B1: 630 nm (Sr, Ca)$AlSiN_3$:Eu (SCASN) |
| Chromaticity x | — | 0.313 | 0.458 |
| Chromaticity y | — | 0.328 | 0.410 |
| duv | — | 0.00 | 0.00 |
| Ra | — | 77.6 | 82.0 |

TABLE 6

Comparative Example 1

| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
|---|---|---|---|---|---|---|---|---|---|---|---|
| Tcp (K) | Tcp (K) | duv | (lm/W) | x | y | Ra | R9 | R12 | | | $I_{PM}/I_{PL}$ |
| 2700 | 2720 | 0.00 | 158 | 0.458 | 0.410 | 82.0 | 13.1 | 67.7 | 100 | 100 | — |
| 3000 | 2994 | 0.00 | 163 | 0.433 | 0.396 | 82.4 | 14.9 | 69.1 | 100 | 100 | — |
| 4000 | 3864 | −0.01 | 171 | 0.382 | 0.367 | 82.9 | 23.0 | 64.9 | 100 | 100 | — |
| 5000 | 4943 | 0.00 | 175 | 0.346 | 0.346 | 81.0 | 18.4 | 57.6 | 100 | 100 | — |
| 6500 | 6514 | 0.00 | 173 | 0.313 | 0.328 | 77.6 | −0.3 | 52.4 | 100 | 100 | 0.19 |

The light emitting device of Comparative Example 1 provided mixed color light by toning the light emitted from the 2,700 K second light source and the light emitted from the 6,500 K second light source. The melanopic ratios and the melanopic light emission efficiencies at the correlated color temperature of the light emitting device of Comparative Example 1 are the references of the melanopic ratios and the melanopic light emission efficiencies at the correlated color temperature of the light emitting devices of Examples and Comparative Examples except for Comparative Example 1. The mixed color light emitted from the light emitting device of Comparative Example 1 had a low light emission intensity ratio $I_{PM}/I_{PL}$ of 0.19, and contained a small amount of the circadian component having a wavelength of from 480 nm to 490 nm influencing the melanopic ratio. In the light emitting device of Comparative Example 1, even in the case where the color temperature was toned to around 2,700 K to around 6,500 K, i.e., a color temperature during morning to noon, the average color rendering index Ra was not changed largely, and the average color rendering index Ra was lowered at around 6,500 K.

Figure 6:
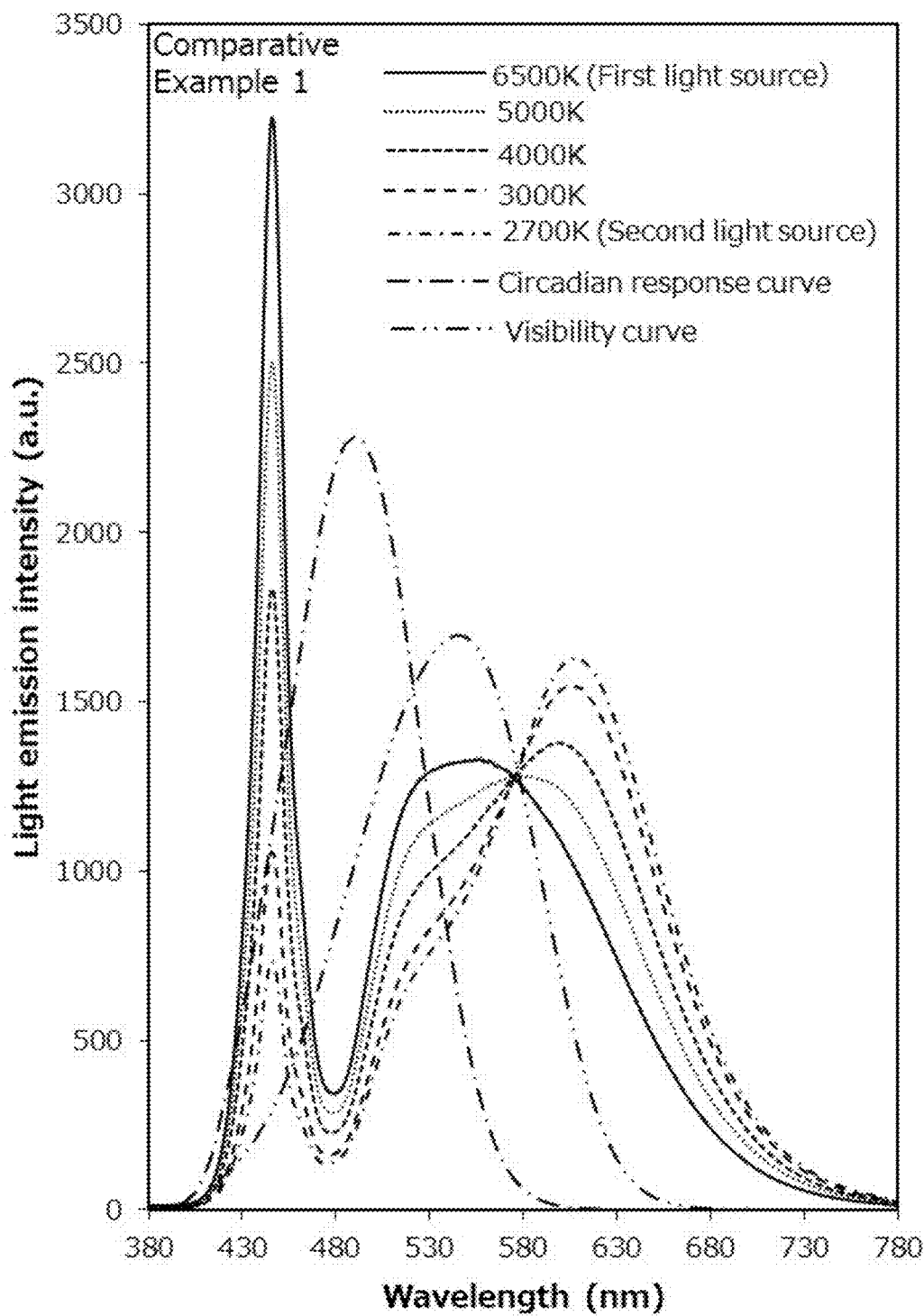
FIG. 6 is a diagram showing the light emission spectra of mixed color light emitted from the light emitting device of Comparative Example 1 at correlated color temperatures of 6,500 K, 5,000 K, 4,000 K, 3,000 K, and 2,700 K, the circadian response curve, and the visibility curve.

FIG. 6 is a diagram showing the light emission spectra of the light emitting device of Comparative Example 1 at correlated color temperatures of around 2,700 K, around 3,000 K, around 4,000 K, around 5,000 K, and around 6,500 K, the circadian response curve, and the visibility curve. In the light emission spectra of the light emitting device of Comparative Example 1, the mixed color light toned to increase the correlated color temperature of from around 2,700 K to around 6,500 K had a tendency that the light emission spectrum of the circadian component having a wavelength of from 480 nm to 490 nm tended to be slightly increased. However, the light emitting device of Comparative Example 1 had a smaller amount of the circadian component than the light emitting device of Example 1, and thus was not suitable as the illumination considering the circadian rhythm.

Example 3

A light emitting device 200 was produced in the same manner as in Example 1 except that (A2) a chlorosilicate fluorescent material having a light emission peak wavelength at 510 nm through excitation with the light emitted from the first light emitting element 11 and a full width at half maximum of 55 nm, having a composition represented by $Ca_8Mg(SiO_4)_4Cl_2$:Eu was used as the first fluorescent material 71 used in the first light source 101.

Table 7 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 3. Table 8 shows the evaluation results of the light emitting device of Example 3.

TABLE 7

| | Example 3 | |
|---|---|---|
| | First light source | Second light source |
| Color temperature | 219914 K | 2720 K |
| Light emitting element | 446 nm nitride semiconductor | 446 nm nitride semiconductor |
| Fluorescent material | A2: 510 nm $Ca_8Mg(SiO_4)_4Cl_2$:Eu (chlorosilicate) | A4-1: 533 nm $Y_3Al_5O_{12}$:Ce (YAG) |
| | — | A4-2: 538 nm $Lu_3Al_5O_{12}$:Ce (LAG) |
| | — | B1: 630 nm (Sr, Ca)$AlSiN_3$:Eu (SCASN) |
| | — | — |
| Chromaticity x | 0.167 | 0.458 |
| Chromaticity y | 0.246 | 0.41 |
| duv | — | 0.00 |
| Ra | — | 82.0 |

TABLE 8

Example 3

| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
|---|---|---|---|---|---|---|---|---|---|---|---|
| Tcp (K) | Tcp (K) | duv | (lm/W) | x | y | Ra | R9 | R12 | | | $I_{PM}/I_{PL}$ |
| 2700 Second light source | 2720 | 0.00 | 158 | 0.458 | 0.410 | 82.0 | 13.1 | 67.7 | 100 | 100 | — |
| 3000 | 2957 | 0.00 | 158 | 0.436 | 0.398 | 84.9 | 20.9 | 76.0 | 102 | 99 | — |
| 4000 | 3816 | −0.01 | 159 | 0.385 | 0.369 | 91.8 | 51.0 | 85.3 | 110 | 102 | — |

TABLE 8-continued

Example 3

| Set correlated color temperature Tcp (K) | Correlated color temperature Tcp (K) | Color deviation duv | Light emission efficiency (lm/W) | Chromaticity x | Chromaticity y | Color rendering index Ra | Color rendering index R9 | Color rendering index R12 | Relative melanopic ratio | Relative melanopic light emission efficiency | Light emission intensity ratio $I_{PM}/I_{PL}$ |
|---|---|---|---|---|---|---|---|---|---|---|---|
| 5000 | 4944 | 0.00 | 158 | 0.346 | 0.347 | 94.2 | 70.0 | 84.3 | 115 | 104 | — |
| 6500 | 6613 | 0.00 | 158 | 0.311 | 0.327 | 93.7 | 79.4 | 84.8 | 119 | 108 | — |
| First light source | 219914 | — | 143 | 0.167 | 0.246 | 0.0 | 0.0 | 0.0 | — | — | 0.31 |

In the light emitting device of Example 3, in the case where the color temperature of the mixed color light obtained by toning the light emitted from the first light source and the light emitted from the second light source was around 4,000 K, around 5,000 K, and around 6,500 K, the relative melanopic ratio was increased by from 10% to 19%, and the relative melanopic light emission efficiency was increased by from 2% to 8%, according to the increase of the color temperature, as compared to the light emitting device of Comparative Example 1. It was understood from the result that in the case where the correlated color temperature was from 4,000 K to 6,500 K, i.e., a correlated color temperature close to that of sunlight during morning to noon, the melanopic ratio could be controlled to a high value for stimulating the circadian rhythm for suppressing the secretion of melatonin. Furthermore, the mixed color light emitted from the light emitting device of Example 3 had a relatively high light emission intensity ratio $I_{PM}/I_{PL}$ of 0.31, contained a large amount of the circadian component having a wavelength of from 480 nm to 490 nm influencing the melanopic ratio, and thus was suitable as the illumination considering the circadian rhythm. In the light emitting device of Example 3, in the case where the color temperature was toned to around 4,000 K to around 6,500 K, i.e., a color temperature during morning to noon, the values of the average color rendering index Ra, the special color rendering index R9, and the special color rendering index R12 were increased, and particularly, the average color rendering index Ra was 85 or more. Accordingly, the light emitting device of Example 3 was particularly suitable for the environmental light for humans performing production activities during the day, such as studies, reading, and general operations.

Figure 7:
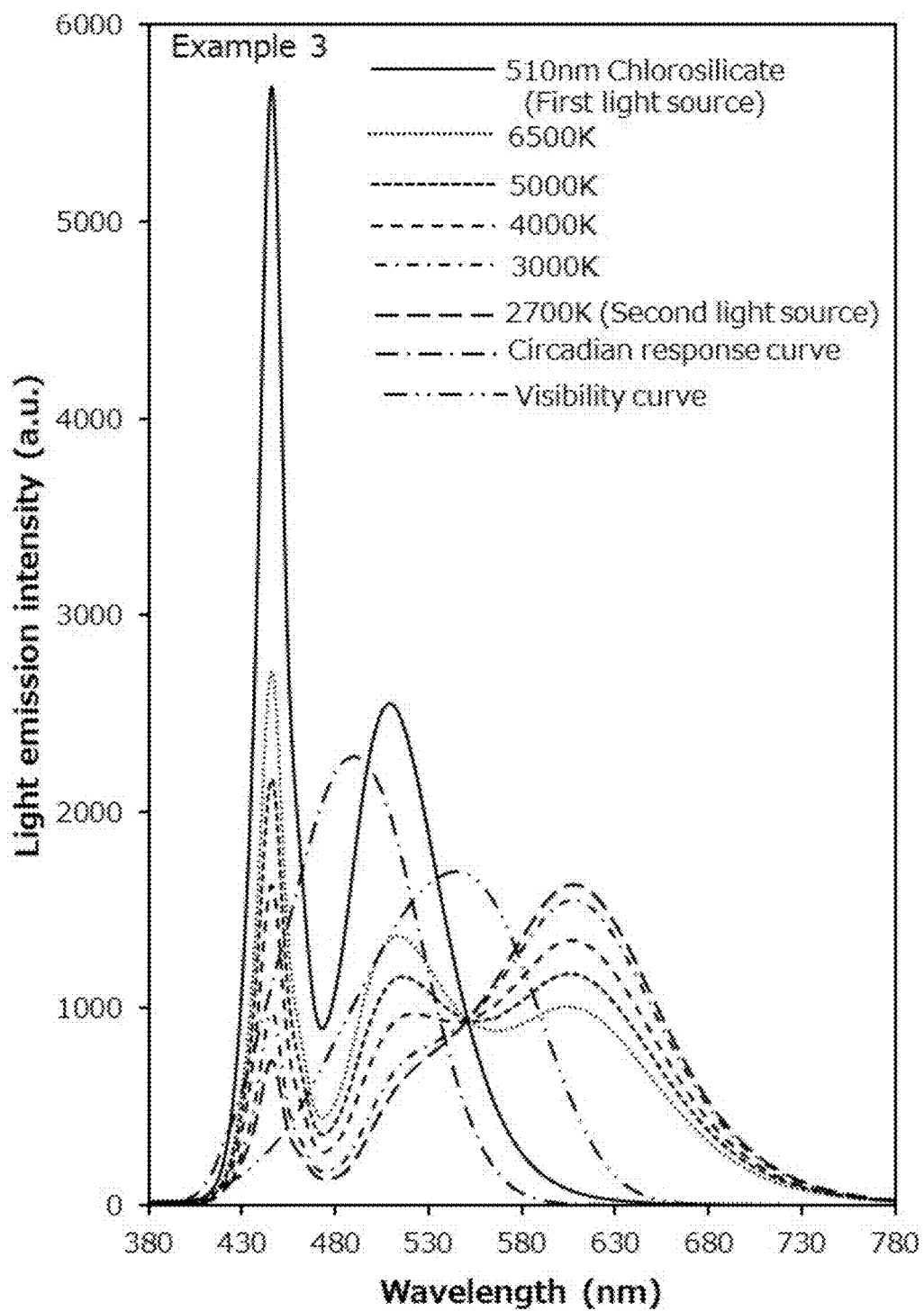
FIG. 7 is a diagram showing the light emission spectra of mixed color light emitted from the light emitting device of Example 3 at correlated color temperatures of 6,500 K, 5,000 K, 4,000 K, 3,000 K, and 2,700 K, the light emission spectrum of only the first light source thereof, the circadian response curve, and the visibility curve.

FIG. 7 is a diagram showing the light emission spectra of the light emitting device of Example 3 at correlated color temperatures of around 2,700 K, around 3,000 K, around 4,000 K, around 5,000 K, and around 6,500 K, the light emission spectrum of only the first light source thereof, the circadian response curve, and the visibility curve. In the light emission spectra of the light emitting device of Example 3, the mixed color light toned to increase the correlated color temperature of from around 2,700 K to around 6,500 K had an increased amount of the circadian component having a wavelength of from 480 nm to 490 nm. Accordingly, the light emitting device of Example 3 could be controlled to have a higher melanopic ratio for stimulating the circadian rhythm.

Comparative Example 2

A light emitting device was produced by using two second light sources 102 including one second light source 102 set to have a correlated color temperature of around 2,700 K as similar to Example 1 (which may be hereinafter referred to as a "2,700 K second light source") and another second light source 102 set to have a correlated color temperature of around 6,500 K (which may be hereinafter referred to as a "6,500 K second light source"), without the use of the first light source 101.

Comparative Example 2: 6,500 K Second Light Source 102

The 6,500 K second light source 102 used a nitride semiconductor having a light emission peak wavelength of 446 nm as the second light emitting element 12. A silicone resin was used as the sealing material of the fluorescent member 52. In the second fluorescent material 72 contained in the 6,500 K second light source 102, as the second fluorescent material A', two kinds of fluorescent materials, i.e., (A2) a chlorosilicate fluorescent material having a light emission peak wavelength at 515 nm and a full width at half maximum of 58 nm, having a composition represented by $Ca_8Mg(SiO_4)_4Cl_2$:Eu and (A4) a YAG fluorescent material having a light emission peak wavelength at 533 nm and a full width at half maximum of 108 nm, were used, and as the second fluorescent material B, (B1) an SCASN fluorescent material having a light emission peak wavelength of 630 nm and a full width at half maximum of 81 nm was used. The amount of the second fluorescent material 72 used was such an amount that the light emitted from the second light source 102 had a correlated color temperature of around 6,500 K and a color deviation duv measured according to JIS Z8725 of around 0, and the mixed color light of the light emitted from the 2,700 K second light source 102 and the light emitted from the 6,500 K second light source 102 had an average color rendering index Ra of 95 or more.

Table 9 shows the set color temperatures, the light emitting elements, the first fluorescent material or the second fluorescent material, the coordinates x and y in the chromaticity diagram of the CIE 1931 color coordinate system, the color deviations, and the average color rendering indices of the 2,700 K second light source and the 6,500 K second light source of the light emitting device of Comparative Example 2. Table 10 shows the evaluation results of the light emitting device of Comparative Example 2.

TABLE 9

| | Comparative Example 2 | | |
|---|---|---|---|
| | First light source | Second light source | |
| Color temperature | — | 6549 K | 2717 K |
| Light emitting element | — | 446 nm nitride semiconductor | 446 nm nitride semiconductor |
| Fluorescent material | — | A2: 515 nm $Ca_8Mg(SiO_4)_4Cl$:Eu (chlorosilicate) | A4-1: 533 nm $Y_3Al_5O_{12}$:Ce (YAG) |

TABLE 9-continued

Comparative Example 2

| | First light source | Second light source | |
|---|---|---|---|
| | — | A4: 533 nm Y$_3$Al$_5$O$_{12}$:Ce (YAG) | A4-2: 538 nm Lu$_3$Al$_5$O$_{12}$:Ce (LAG) |
| | — | B1: 630 nm (Sr, Ca)AlSiN$_3$:Eu (SCASN) | B1: 630 nm (Sr, Ca)AlSiN$_3$:Eu (SCASN) |
| | — | — | — |
| Chromaticity x | — | 0.312 | 0.457 |
| Chromaticity y | — | 0.329 | 0.410 |
| duv | — | 0.00 | 0.00 |
| Ra | — | 86.9 | 94.8 |

TABLE 10

Comparative Example 2

| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
|---|---|---|---|---|---|---|---|---|---|---|---|
| Tcp (K) | Tcp (K) | duv | (lm/W) | x | y | Ra | R9 | R12 | | | $I_{PM}/I_{PL}$ |
| 2700 | 2717 | 0.00 | 139 | 0.457 | 0.410 | 94.8 | 63.6 | 98.3 | 120 | 106 | — |
| 3000 | 2993 | 0.00 | 144 | 0.434 | 0.397 | 94.8 | 71.8 | 98.2 | 117 | 103 | — |
| 4000 | 3894 | −0.01 | 153 | 0.382 | 0.368 | 94.1 | 83.0 | 87.2 | 113 | 101 | — |
| 5000 | 4981 | 0.00 | 158 | 0.345 | 0.348 | 91.8 | 78.7 | 75.5 | 110 | 100 | — |
| 6500 | 6549 | 0.00 | 158 | 0.312 | 0.329 | 86.9 | 58.8 | 67.6 | 109 | 100 | 0.21 |

The light emitting device of Comparative Example 2 provided mixed color light by toning the light emitted from the 2,700 K second light source and the light emitted from the 6,500 K second light source. For the color temperature of the mixed color light obtained by the light emitting device of Comparative Example 2, the relative melanopic ratios at around 4,000 K, around 5,000 K, and around 6,500 K were higher than the emitted light from the light emitting device of Comparative Example 1. However, the values of the relative melanopic ratio were higher at around 2,700 K and around 3,000 K, and in the case of the color temperatures close to the light in the evening and the sunset, such light was emitted that inhibited sleep by suppressing the secretion of melatonin, although the secretion of melatonin should be facilitated in this case. Accordingly, the light emitting device of Comparative Example 2 was not suitable as the illumination considering the circadian rhythm. Furthermore, the mixed color light emitted from the light emitting device of Comparative Example 2 had a light emission intensity ratio $I_{PM}/I_{PL}$ of 0.21, which was higher than the light emission intensity ratio $I_{PM}/I_{PL}$ of the mixed color light emitted from the light emitting device of Comparative Example 1, but due to the low light emission efficiency thereof, the relative melanopic light emission efficiency of the toned mixed color light emitted from the light emitting device of Comparative Example 2 was equivalent to the relative melanopic light emission efficiency of the mixed color light emitted from the light emitting device of Comparative Example 1. The average color rendering index Ra, the special color rendering index R9, and the special color rendering index R12 of the mixed color light emitted from the light emitting device of Comparative Example 2 were higher than Comparative Example 1, and thus the target light emission efficiency was maintained. However, the light emitting device of Comparative Example 2 had the higher values of the relative melanopic ratio at low correlated color temperatures of around 2,700 K and around 3,000 K as described above, failing to control the melanopic ratio, and thus was not the illumination considering the circadian rhythm.

Figure 8:
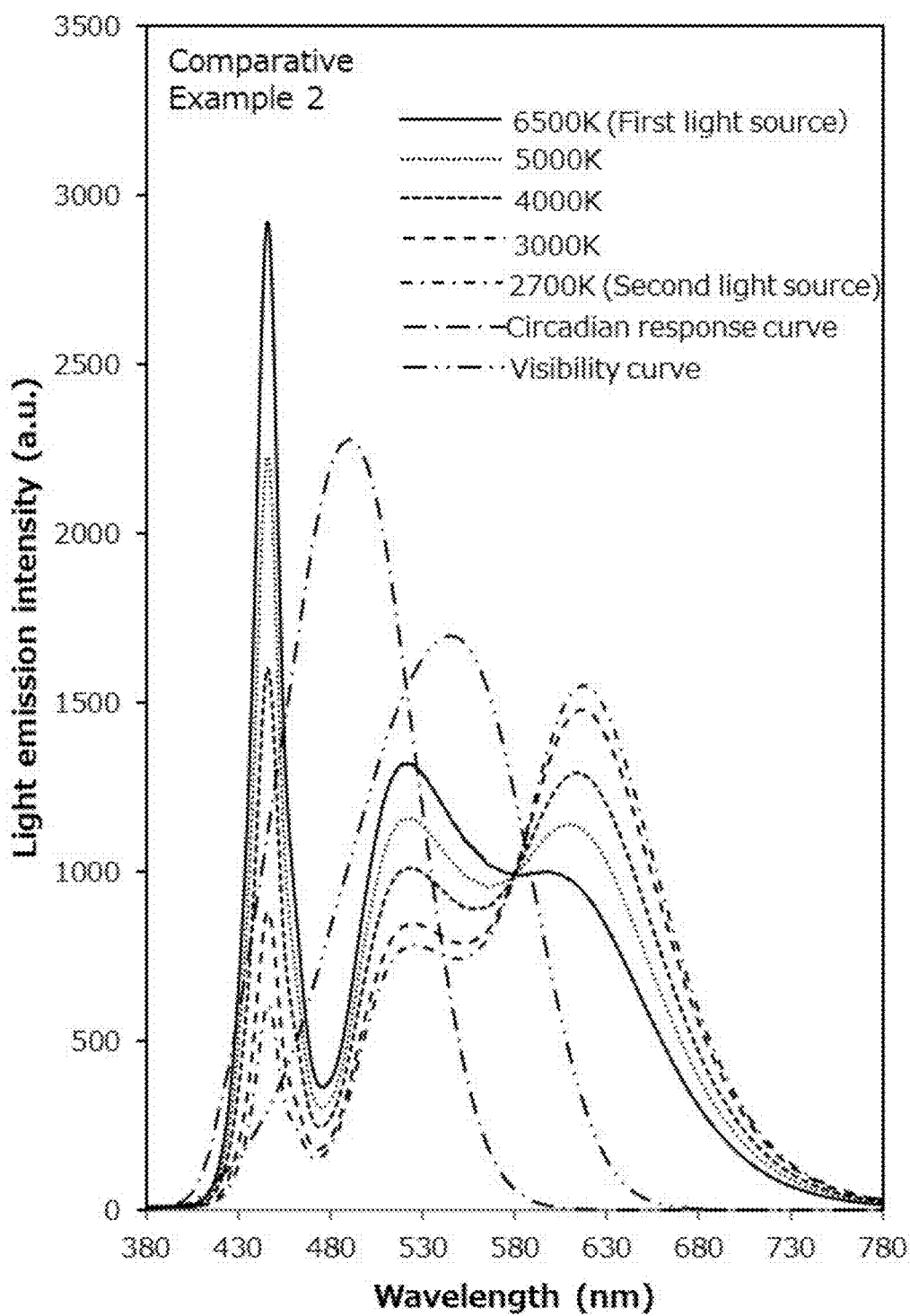
FIG. 8 is a diagram showing the light emission spectra of mixed color light emitted from the light emitting device of Comparative Example 2 at correlated color temperatures of 6,500 K, 5,000 K, 4,000 K, 3,000 K, and 2,700 K, the circadian response curve, and the visibility curve.

FIG. 8 is a diagram showing the light emission spectra of the light emitting device of Comparative Example 2 at correlated color temperatures of around 2,700 K, around 3,000 K, around 4,000 K, around 5,000 K, and around 6,500 K, the circadian response curve, and the visibility curve. In the light emission spectra of the light emitting device of Comparative Example 2, the mixed color light toned to increase the correlated color temperature of from around 2,700 K to around 6,500 K had a tendency that the light emission spectrum of the circadian component having a wavelength of from 480 nm to 490 nm tended to be slightly increased. However, the light emitting device of Comparative Example 2 had a smaller amount of the circadian component than the light emitting device of Example 3, and thus was not suitable as the illumination considering the circadian rhythm.

Example 4

A light emitting device 200 was produced in the same manner as in Example 1 except that (A4) an LAG fluorescent material having a light emission peak wavelength at 496 nm through excitation with the light emitted from the first light emitting element 11 and a full width at half maximum of 96 nm was used as the first fluorescent material 71 used in the first light source 101.

Table 11 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 4. Table 12 shows the evaluation results of the light emitting device of Example 4.

TABLE 11

Example 4

| | First light source | Second light source |
|---|---|---|
| Color temperature | 444899 K | 2720 K |
| Light emitting element | 446 nm nitride semiconductor | 446 nm nitride semiconductor |

TABLE 11-continued

Example 4

| | First light source | Second light source |
|---|---|---|
| Fluorescent material | A4: 496 nm Lu$_3$Al$_5$O$_{12}$:Ce (LAG) | A4-1: 533 nm Y$_3$Al$_5$O$_{12}$:Ce (YAG) |
| | — | A4-2: 538 nm Lu$_3$Al$_5$O$_{12}$:Ce (LAG) |
| | — | B1: 630 nm (Sr, Ca)AlSiN$_3$:Eu (SCASN) |
| Chromaticity x | 0.191 | 0.458 |
| Chromaticity y | 0.265 | 0.41 |
| duv | — | 0.00 |
| Ra | — | 82.0 |

TABLE 12

Example 4

| Set correlated color temperature Tcp (K) | Correlated color temperature Tcp (K) | Color deviation duv | Light emission efficiency (lm/W) | Chromaticity x | Chromaticity y | Color rendering index Ra | Color rendering index R9 | Color rendering index R12 | Relative melanopic ratio | Relative melanopic light emission efficiency | Light emission intensity ratio $I_{PM}/I_{PL}$ |
|---|---|---|---|---|---|---|---|---|---|---|---|
| 2700 | 2720 | 0.00 | 158 | 0.458 | 0.410 | 82.0 | 13.1 | 67.7 | 100 | 100 | — |
| Second light source | | | | | | | | | | | |
| 3000 | 2971 | 0.00 | 159 | 0.435 | 0.398 | 84.8 | 20.2 | 76.2 | 104 | 101 | — |
| 4000 | 3849 | 0.00 | 159 | 0.384 | 0.370 | 91.4 | 46.0 | 81.8 | 114 | 106 | — |
| 5000 | 4919 | 0.00 | 159 | 0.347 | 0.350 | 94.0 | 59.2 | 77.9 | 119 | 108 | — |
| 6500 | 6609 | 0.01 | 158 | 0.311 | 0.330 | 94.6 | 62.0 | 77.9 | 124 | 113 | — |
| First light source | 444899 | — | 146 | 0.191 | 0.265 | 0.0 | 0.0 | 0.0 | — | — | 0.50 |

In the light emitting device of Example 4, in the case where the color temperature of the mixed color light obtained by toning the light emitted from the first light source and the light emitted from the second light source was around 3,000 K, around 4,000 K, around 5,000 K, and around 6,500 K, the relative melanopic ratio was increased by from 4% to 24%, and the relative melanopic light emission efficiency was increased by from 1% to 13%, according to the increase of the color temperature, as compared to the light emitting device of Comparative Example 1. It was understood from the result that in the case where the correlated color temperature was from 3,000 K to 6,500 K, i.e., a correlated color temperature close to that of sunlight during morning to noon, the melanopic ratio could be controlled to a high value for stimulating the circadian rhythm for suppressing the secretion of melatonin. Furthermore, the mixed color light emitted from the light emitting device of Example 4 had a relatively high light emission intensity ratio $I_{PM}/I_{PL}$ of 0.50, and contained a large amount of the circadian component having a wavelength of from 480 nm to 490 nm influencing the melanopic ratio. In the light emitting device of Example 4, in the case where the color temperature was toned to around 3,000 K to around 6,500 K, i.e., a color temperature during morning to noon, the values of the average color rendering index Ra, the special color rendering index R9, and the special color rendering index R12 were increased, and thus color rendering capability sufficient for the visual environment for the human general operation was achieved. In particular, at around 3,000 K, around 4,000 K, around 5,000 K, and around 6,500 K, the mixed color light emitted from the light emitting device of Example 4 had an average color rendering index Ra of 75 or more, and mixed color light that was particularly suitable for the environmental light for humans performing production activities during the day, such as studies, reading, and general operations, was obtained. For example, at around 5,000 K and around 6,500 K, the light emission spectrum of the sunlight was used as the reference light source, and it was confirmed that the light emitting device of Example 4 provided the mixed color light close to sunlight, and thus was suitable as the illumination considering the circadian rhythm.

Figure 9:
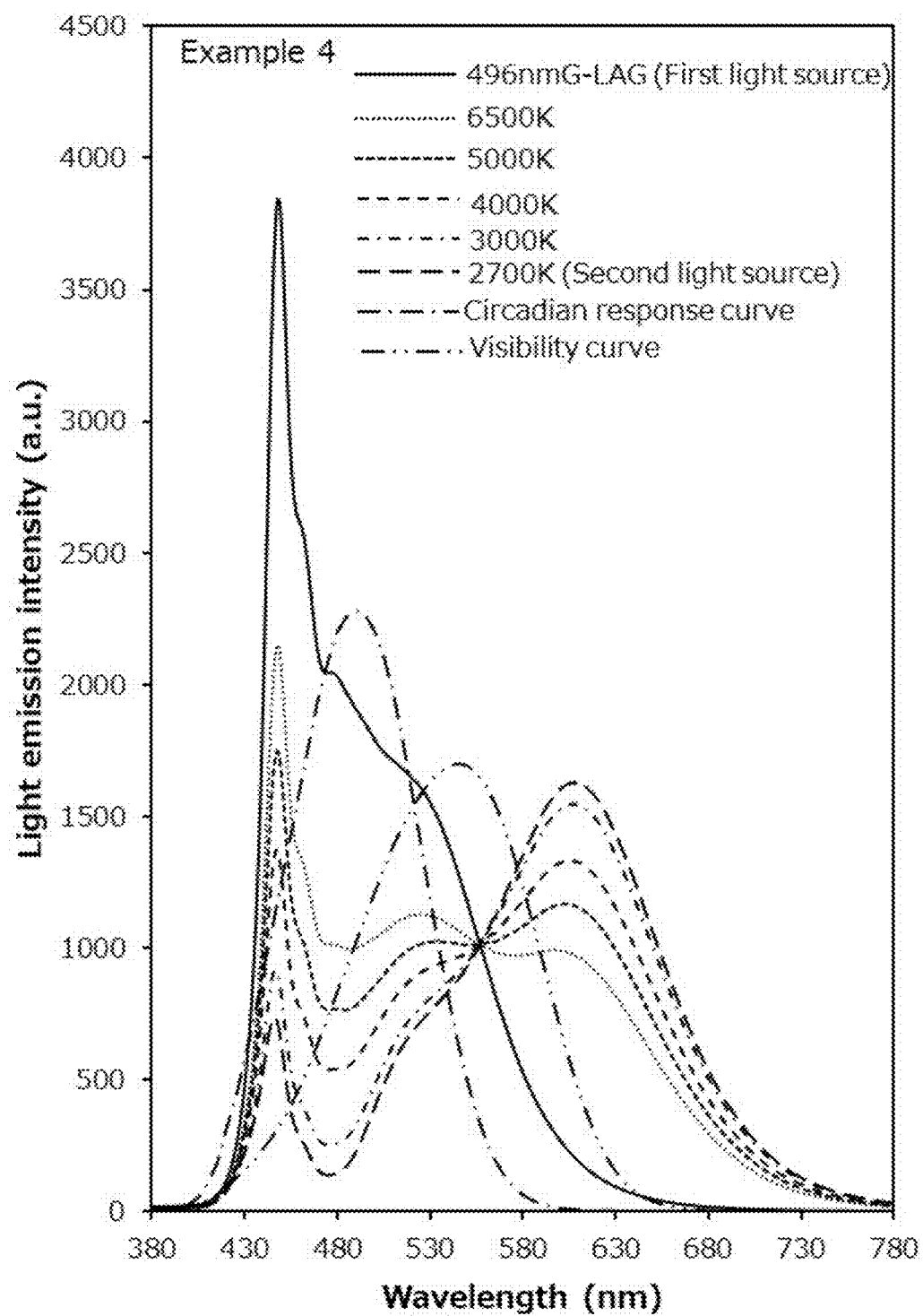
FIG. 9 is a diagram showing the light emission spectra of mixed color light emitted from the light emitting device of Example 4 at correlated color temperatures of 6,500 K, 5,000 K, 4,000 K, 3,000 K, and 2,700 K, the light emission spectrum of only the first light source thereof, the circadian response curve, and the visibility curve.

FIG. 9 is a diagram showing the light emission spectra of the light emitting device of Example 4 at correlated color temperatures of around 2,700 K, around 3,000 K, around 4,000 K, around 5,000 K, and around 6,500 K, the light emission spectrum of only the first light source thereof, the circadian response curve, and the visibility curve. In the light emission spectra of the light emitting device of Example 4, the mixed color light toned to increase the correlated color temperature of from around 2,700 K to around 6,500 K had an increased amount of the circadian component having a wavelength of from 480 nm to 490 nm, enabling the control of the melanopic ratio for stimulating the circadian rhythm, and the light emitting device of Example 4 was significantly suitable as the illumination considering the circadian rhythm.

Comparative Example 3

A light emitting device was produced in the same manner as in Example 1 by using two second light sources 102 including one second light source 102 set to have a correlated color temperature of around 2,700 K (which may be hereinafter referred to as a "2,700 K second light source") and another second light source 102 set to have a correlated color temperature of around 6,500 K (which may be hereinafter referred to as a "6,500 K second light source"), without the use of the first light source 101.

Comparative Example 3: 2,700 K Second Light Source 102

The 2,700 K second light source 102 used a nitride semiconductor having a light emission peak wavelength of 446 nm as the second light emitting element 12. A silicone resin was used as the sealing material of the fluorescent member 52. In the second fluorescent material 72 contained in the 2,700 K second light source 102, four kinds of fluorescent materials were used, specifically, as the second fluorescent material A', two kinds of fluorescent materials, i.e., (A2) a chlorosilicate fluorescent material having a light emission peak wavelength at 523 nm and a full width at half maximum of 63 nm, having a composition represented by Ca$_8$Mg(SiO$_4$)$_4$Cl$_2$:Eu and (A4-2) an LAG fluorescent material having a light emission peak wavelength at 538 nm and a full width at half maximum of 105 nm, were used, and as the second fluorescent material B, (B1) an SCASN fluorescent material having a light emission peak wavelength of 640 nm and a full width at half maximum of 92 nm was used, and as the second fluorescent material C, (C1) a fluorogermanate fluorescent material having a light emission peak wavelength at 660 nm and a full width at half maximum of 31 nm, having a composition represented by 3.5MgO.0.5MgF$_2$.GeO$_2$:Mn (which may be hereinafter referred to as an "MGF fluorescent material") was used.

Comparative Example 3: 6,500 K Second Light Source 102

The 6,500 K second light source 102 used a nitride semiconductor having a light emission peak wavelength of 446 nm as the second light emitting element 12. A silicone resin was used as the sealing material of the fluorescent member 52. In the second fluorescent material 72 contained in the 6,500 K second light source 102, as the second fluorescent material A', two kinds of fluorescent materials, i.e., (A1) an SAE fluorescent material having a light emission peak wavelength at 495 nm and a full width at half maximum of 68 nm and (A4) an LAG fluorescent material having a light emission peak wavelength at 544 nm and a full width at half maximum of 106 nm, were used, and as the second fluorescent material B, (B1) an SCASN fluorescent material having a light emission peak wavelength of 640 nm and a full width at half maximum of 91 nm was used, and as the second fluorescent material C, (C1) an MGF fluorescent material having a light emission peak wavelength at 660 nm and a full width at half maximum of 31 nm, having a composition represented by 3.5MgO.0.5MgF$_2$.GeO$_2$:Mn was used. The second light source 102 was produced in the same manner as in Comparative Example 1 except that the second fluorescent material 72 was used. The amount of the second fluorescent material 72 used was such an amount that the light emitted from the second light source 102 had a correlated color temperature of around 6,500 K and a color deviation duv measured according to JIS Z8725 of around 0, and the mixed color light of the light emitted from the 2,700 K second light source 102 and the light emitted from the 6,500 K second light source 102 had an average color rendering index Ra of 95 or more.

Table 13 shows the set color temperatures, the light emitting elements, the first fluorescent material or the second fluorescent material, the coordinates x and y in the chromaticity diagram of the CIE 1931 color coordinate system, the color deviations, and the average color rendering indices of the 2,700 K second light source and the 6,500 K second light source of the light emitting device of Comparative Example 3. Table 14 shows the evaluation results of the light emitting device of Comparative Example 3.

TABLE 13

| | Comparative Example 3 | | |
|---|---|---|---|
| | First light source | Second light source | |
| Color temperature | — | 6065 K | 2707 K |
| Light emitting element | — | 446 nm nitride semiconductor | 446 nm nitride semiconductor |
| Fluorescent material | — | A1: 495 nm Sr$_4$Al$_{14}$O$_{25}$:Eu (SAE) | A2: 523 nm Ca$_8$Mg(SiO$_4$)$_4$Cl:Eu (chlorosilicate) |
| | — | A4: 544 nm Lu$_3$Al$_5$O$_{12}$:Ce (LAG) | A4-2: 538 nm Lu$_3$Al$_5$O$_{12}$:Ce (LAG) |
| | — | B1: 640 nm (Sr, Ca)AlSiN$_3$:Eu (SCASN) | B1: 640 nm (Sr, Ca)AlSiN$_3$:Eu (SCASN) |
| | — | C1: 660 nm 3.5MgO•0.5MgF$_2$•GeO$_2$:Mn (MGF) | C1: 660 nm 3.5MgO•0.5MgF$_2$•GeO$_2$:Mn (MGF) |
| Chromaticity x | — | 0.321 | 0.460 |
| Chromaticity y | — | 0.332 | 0.412 |
| duv | — | 0.00 | 0.00 |
| Ra | — | 97.0 | 98.6 |

TABLE 14

| | | | | | | | | | | | |
|---|---|---|---|---|---|---|---|---|---|---|---|
| | | | | Comparative Example 3 | | | | | | | |
| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
| Tcp (K) | Tcp (K) | duv | (lm/W) | x | y | Ra | R9 | R12 | | | $I_{PM}/I_{PL}$ |
| 2700 | 2707 | 0.00 | 123 | 0.460 | 0.412 | 98.6 | 96.5 | 86.6 | 119 | 88 | — |
| 3000 | 3001 | 0.00 | 129 | 0.433 | 0.397 | 97.8 | 96.4 | 86.0 | 119 | 87 | — |
| 4000 | 3866 | −0.01 | 138 | 0.383 | 0.367 | 96.4 | 87.2 | 81.1 | 120 | 88 | — |
| 5000 | 4967 | 0.00 | 144 | 0.345 | 0.345 | 97.4 | 91.1 | 73.9 | 120 | 83 | — |
| 6500 | 6065 | 0.00 | 146 | 0.321 | 0.332 | 97.0 | 97.3 | 73.5 | 116 | 83 | 0.33 |

The light emitting device of Comparative Example 3 provided mixed color light by toning the light emitted from the 2,700 K second light source and the light emitted from the 6,500 K second light source. For the color temperature of the mixed color light obtained by the light emitting device of Comparative Example 3, the relative melanopic ratios at around 4,000 K, around 5,000 K, and around 6,500 K were higher than the emitted light from the light emitting device of Comparative Example 1. However, the values of the relative melanopic ratio were higher at around 2,700 K and around 3,000 K, and in the case of the color temperatures close to the light in the evening to the sunset, such light was emitted that inhibited sleep by suppressing the secretion of melatonin, although the secretion of melatonin should be facilitated in this case. Accordingly, the light emitting device of Comparative Example 3 was not suitable as the illumination considering the circadian rhythm. Furthermore, the mixed color light emitted from the light emitting device of Comparative Example 3 had a light emission intensity ratio $I_{PM}/I_{PL}$ of 0.33, which was higher than the light emission intensity ratio $I_{PM}/I_{PL}$ of the mixed color light emitted from the light emitting device of Comparative Example 1, but due to the low light emission efficiency thereof, the relative melanopic light emission efficiency of the toned mixed color light emitted from the light emitting device of Comparative Example 3 was lower than the relative melanopic light emission efficiency of the mixed color light emitted from the light emitting device of Comparative Example 1. The average color rendering index Ra, the special color rendering index R9, and the special color rendering index R12 of the mixed color light emitted from the light emitting device of Comparative Example 3 were relatively high, and thus the target light emission efficiency was maintained. However, the light emitting device of Comparative Example 3 had the higher values of the relative melanopic ratio at low correlated color temperatures of around 2,700 K and around 3,000 K as described above. Accordingly, the light emitting device of Comparative Example 3 failed to control the melanopic ratio, and thus was not the illumination considering the circadian rhythm.

Figure 10:
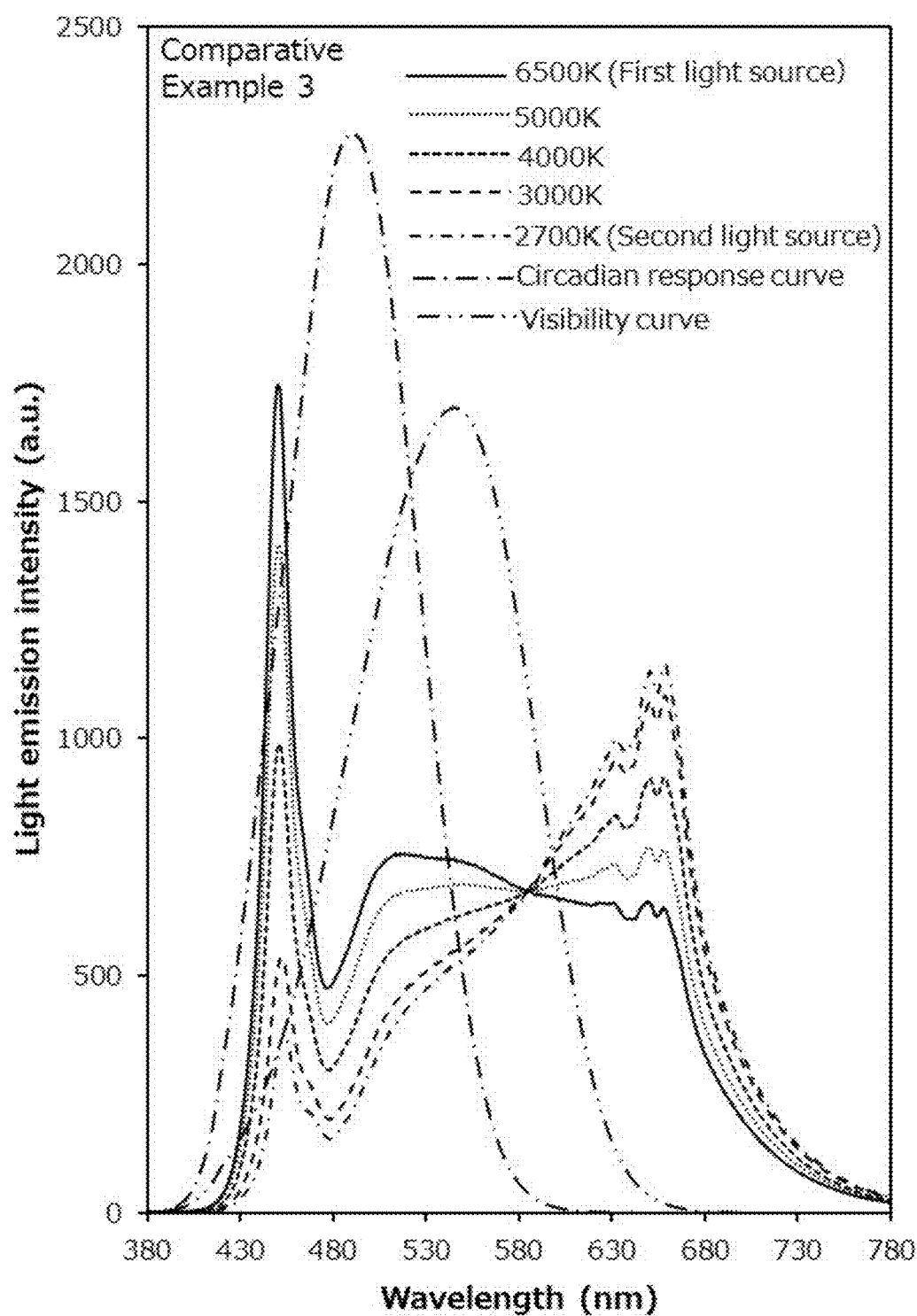
FIG. 10 is a diagram showing the light emission spectra of mixed color light emitted from the light emitting device of Comparative Example 3 at correlated color temperatures of 6,500 K, 5,000 K, 4,000 K, 3,000 K, and 2,700 K, the circadian response curve, and the visibility curve.

FIG. 10 is a diagram showing the light emission spectra of the light emitting device of Comparative Example 3 at correlated color temperatures of around 2,700 K, around 3,000 K, around 4,000 K, around 5,000 K, and around 6,500 K, the circadian response curve, and the visibility curve. In the light emission spectra of the light emitting device of Comparative Example 3, the mixed color light toned to increase the correlated color temperature of from around 2,700 K to around 6,500 K had a tendency that the light emission spectrum of the circadian component having a wavelength of from 480 nm to 490 nm tended to be slightly increased. However, the light emitting device of Comparative Example 3 had a smaller amount of the circadian component than the light emitting device of Example 3, and thus was not suitable as the illumination considering the circadian rhythm.

Example 5

A light emitting device 200 was produced in the same manner as in Example 1 except that (A4) an LAG fluorescent material having a light emission peak wavelength at 517 nm through excitation with the light emitted from the first light emitting element 11 and a full width at half maximum of 97 nm was used as the first fluorescent material 71 used in the first light source 101.

Table 15 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 5. Table 16 shows the evaluation results of the light emitting device of Example 5.

TABLE 15

| | Example 5 | |
|---|---|---|
| | First light source | Second light source |
| Color temperature | 50249 K | 2720 K |
| Light emitting element | 446 nm nitride semiconductor | 446 nm nitride semiconductor |
| Fluorescent material | A4: 517 nm $Lu_3Al_5O_{12}$:Ce (LAG) | A4-1: 533 nm $Y_3Al_5O_{12}$:Ce (YAG) |
| | — | A4-2: 538 nm $Lu_3Al_5O_{12}$:Ce (LAG) |
| | — | B1: 630 nm (Sr, Ca)$AlSiN_3$:Eu (SCASN) |
| Chromaticity x | 0.208 | 0.458 |
| Chromaticity y | 0.272 | 0.41 |
| duv | — | 0.00 |
| Ra | — | 82.0 |

TABLE 16

| | | | | | | | | | | | |
|---|---|---|---|---|---|---|---|---|---|---|---|
| | | | | Example 5 | | | | | | | |
| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
| Tcp (K) | Tcp (K) | duv | (lm/W) | x | y | Ra | R9 | R12 | | | $I_{PM}/I_{PL}$ |
| 2700 Second light source | 2720 | 0.00 | 158 | 0.458 | 0.410 | 82.0 | 13.1 | 67.7 | 100 | 100 | — |
| 3000 | 3008 | −0.01 | 160 | 0.432 | 0.396 | 84.6 | 20.3 | 75.6 | 105 | 103 | — |
| 4000 | 3860 | 0.00 | 162 | 0.383 | 0.369 | 89.8 | 41.6 | 80.2 | 111 | 105 | — |
| 5000 | 4962 | 0.00 | 163 | 0.346 | 0.348 | 91.8 | 51.3 | 76.6 | 115 | 108 | — |
| 6500 | 6525 | 0.00 | 164 | 0.312 | 0.330 | 91.7 | 50.1 | 76.5 | 118 | 111 | — |
| First light source | 50294 | — | 157 | 0.208 | 0.272 | 0.0 | 0.0 | 0.0 | — | — | 0.41 |

In the light emitting device of Example 5, in the case where the color temperature of the mixed color light obtained by toning the light emitted from the first light source and the light emitted from the second light source was around 4,000 K, around 5,000 K, and around 6,500 K, the relative melanopic ratio was increased by from 5% to 18%, and the relative melanopic light emission efficiency was increased by from 3% to 11%, according to the increase of the color temperature, as compared to the light emitting device of Comparative Example 1. It was understood from the result that in the case where the correlated color temperature was from 4,000 K to 6,500 K, i.e., a correlated color temperature close to that of sunlight during morning to noon, the melanopic ratio could be controlled to a high value for stimulating the circadian rhythm for suppressing the secretion of melatonin. Furthermore, the mixed color light emitted from the light emitting device of Example 5 had a relatively high light emission intensity ratio $I_{PM}/I_{PL}$ of 0.41, and effectively contained the circadian component having a wavelength of from 480 nm to 490 nm influencing the melanopic ratio. In the light emitting device of Example 5, in the case where the color temperature was toned to around 3,000 K to around 6,500 K, i.e., a color temperature during morning to noon, the values of the average color rendering index Ra, the special color rendering index R9, and the special color rendering index R12 were increased, particularly the average color rendering index Ra was 70 or more, and thus color rendering capability sufficient for the visual environment for the human general operation was achieved.

Figure 11:
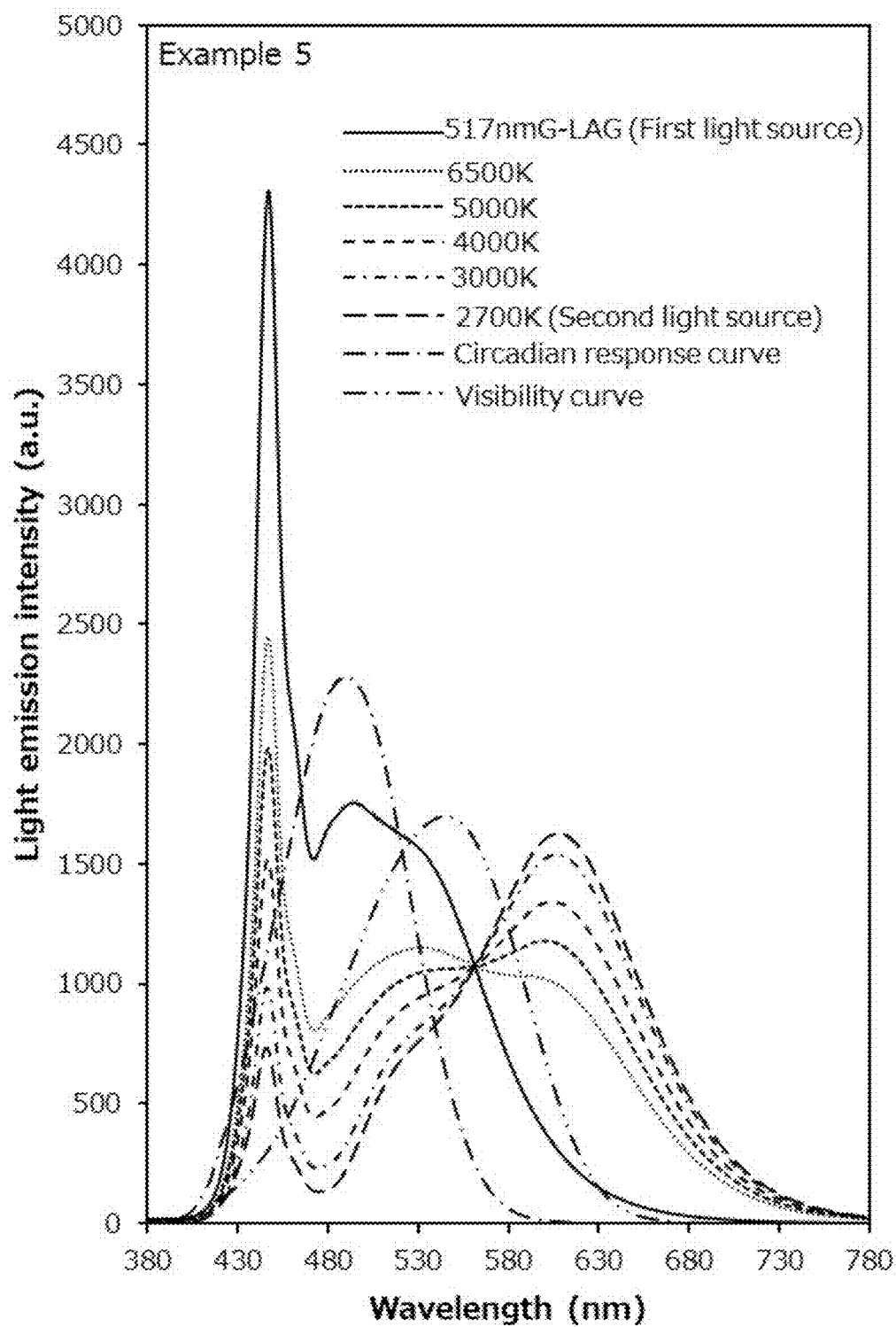
FIG. 11 is a diagram showing the light emission spectra of mixed color light emitted from the light emitting device of Example 5 at correlated color temperatures of 6,500 K, 5,000 K, 4,000 K, 3,000 K, and 2,700 K, the light emission spectrum of only the first light source thereof, the circadian response curve, and the visibility curve.

FIG. 11 is a diagram showing the light emission spectra of the light emitting device of Example 5 at correlated color temperatures of around 2,700 K, around 3,000 K, around 4,000 K, around 5,000 K, and around 6,500 K, the light emission spectrum of only the first light source thereof, the circadian response curve, and the visibility curve. In the light emission spectra of the light emitting device of Example 5, the mixed color light toned to increase the correlated color temperature of from around 2,700 K to around 6,500 K had an increased amount of the circadian component having a wavelength of from 480 nm to 490 nm, enabling the control of the melanopic ratio for stimulating the circadian rhythm. It was confirmed that the light emitting device of Example 5 provided the mixed color light close to sunlight, and thus was suitable as the illumination considering the circadian rhythm.

Example 6

A light emitting device 200 was produced in the same manner as in Example 1 except that (A4) a YAG fluorescent material having a light emission peak wavelength at 517 nm through excitation with the light emitted from the first light emitting element 11 and a full width at half maximum of 104 nm was used as the first fluorescent material 71 used in the first light source 101.

Table 17 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Example 6. Table 18 shows the evaluation results of the light emitting device of Example 6.

TABLE 17

| | Example 6 | |
|---|---|---|
| | First light source | Second light source |
| Color temperature | 16724 K | 2720 K |
| Light emitting element | 446 nm nitride semiconductor | 446 nm nitride semiconductor |
| Fluorescent material | A4: 517 nm $Y_3Al_5O_{12}$:Ce (YAG) | A4-1: 533 nm $Y_3Al_5O_{12}$:Ce (YAG) |
| | — | A4-2: 538 nm $Lu_3Al_5O_{12}$:Ce (LAG) |
| | — | B1: 630 nm (Sr, Ca)$AlSiN_3$:Eu (SCASN) |
| | — | — |
| Chromaticity x | 0.238 | 0.458 |
| Chromaticity y | 0.289 | 0.41 |
| duv | — | 0.00 |
| Ra | — | 82.0 |

TABLE 18

| | | | | | | | | | | Relative melanopic light emission | Light emission intensity |
| Set correlated color temperature | Correlated color temperature | Color deviation | Light emission efficiency | Chromaticity | | Color rendering index | | | Relative melanopic | efficiency | ratio |
| Tcp (K) | Tcp (K) | duv | (lm/W) | x | y | Ra | R9 | R12 | ratio | | $I_{PM}/I_{PL}$ |
|---|---|---|---|---|---|---|---|---|---|---|---|
| 2700 | 2720 | 0.00 | 158 | 0.458 | 0.410 | 82.0 | 13.1 | 67.7 | 100 | 100 | — |
| Second light source | | | | | | | | | | | |
| 3000 | 2993 | 0.00 | 161 | 0.433 | 0.396 | 83.8 | 18.1 | 73.2 | 104 | 102 | — |
| 4000 | 3847 | −0.01 | 165 | 0.385 | 0.370 | 87.2 | 33.5 | 74.8 | 106 | 102 | — |
| 5000 | 5010 | 0.00 | 168 | 0.346 | 0.348 | 87.8 | 37.3 | 69.9 | 110 | 105 | — |
| 6500 | 6423 | 0.00 | 169 | 0.312 | 0.329 | 86.1 | 28.0 | 68.1 | 112 | 109 | — |
| First light source | 16724 | — | 166 | 0.238 | 0.289 | 0.0 | 0.0 | 0.0 | — | — | 0.29 |

In the light emitting device of Example 6, in the case where the color temperature of the mixed color light obtained by toning the light emitted from the first light source and the light emitted from the second light source was around 4,000 K, around 5,000 K, and around 6,500 K, the relative melanopic ratio was increased by from 6% to 12%, and the relative melanopic light emission efficiency was increased by from 2% to 9%, according to the increase of the color temperature, as compared to the light emitting device of Comparative Example 1. It was understood from the result that in the case where the correlated color temperature was from 4,000 K to 6,500 K, i.e., a correlated color temperature close to that of sunlight during morning to noon, the melanopic ratio could be controlled to a high value for stimulating the circadian rhythm for suppressing the secretion of melatonin. Furthermore, the mixed color light emitted from the light emitting device of Example 6 had a relatively high light emission intensity ratio $I_{PM}/I_{PL}$ of 0.29, and contained a large amount of the circadian component having a wavelength of from 480 nm to 490 nm influencing the melanopic ratio. In the light emitting device of Example 6, in the case where the color temperature was toned to around 4,000 K to around 6,500 K, i.e., a color temperature during morning to noon, the values of the average color rendering index Ra, the special color rendering index R9, and the special color rendering index R12 were increased, and particularly the average color rendering index Ra was 85 or more. This means that the light emitting device of Example 6 is particularly suitable for the environmental light for humans performing production activities during the day, such as studies, reading, and general operations.

Figure 12:
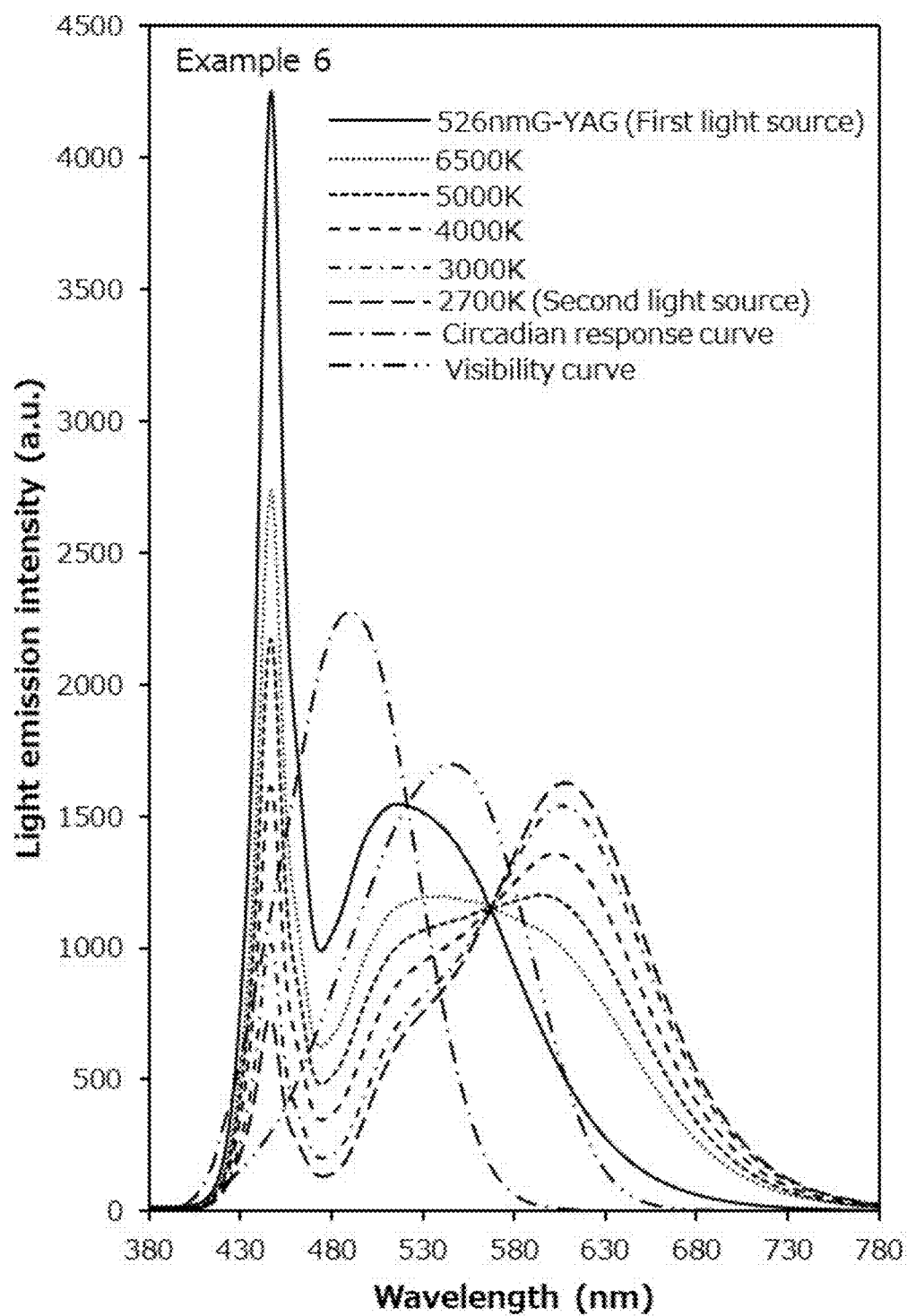
FIG. 12 is a diagram showing the light emission spectra of mixed color light emitted from the light emitting device of Example 6 at correlated color temperatures of 6,500 K, 5,000 K, 4,000 K, 3,000 K, and 2,700 K, the light emission spectrum of only the first light source thereof, the circadian response curve, and the visibility curve.

FIG. 12 is a diagram showing the light emission spectra of the light emitting device of Example 6 at correlated color temperatures of around 2,700 K, around 3,000 K, around 4,000 K, around 5,000 K, and around 6,500 K, the light emission spectrum of only the first light source thereof, the circadian response curve, and the visibility curve. In the light emission spectra of the light emitting device of Example 6, the mixed color light toned to increase the correlated color temperature of from around 2,700 K to around 6,500 K had an increased amount of the circadian component having a wavelength of from 480 nm to 490 nm, enabling the control of the melanopic ratio for stimulating the circadian rhythm. It was confirmed that the light emitting device of Example 6 provided the mixed color light close to sunlight, and thus the light emitting device of Example 6 was suitable as the illumination considering the circadian rhythm.

Comparative Example 4

A light emitting device was produced by using the first light source 101 described later and the second light source 102 set to have a correlated color temperature of around 2,700 K as similar to Example 1 (which may be hereinafter referred to as a "2,700 K second light source"). As the first fluorescent material 71 used in the first light source 101, (A2) a chlorosilicate fluorescent material having a light emission peak wavelength at 527 nm through excitation with the light emitted from the first light emitting element 11 and a full width at half maximum of 64 nm, having a composition represented by $Ca_8Mg(SiO_4)_4Cl_2:Eu$ was used. The first fluorescent material 71 contained in the first light source 101 was used in such an amount that provided x of 0.199 (x=0.199) and y of 0.265 (y=0.265) in the chromaticity diagram of the CIE 1931 color coordinate system. The amount of the first fluorescent material 71 contained in the first light source 101 was such an amount that in the light emission spectrum of the light emitting device 200, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 derived from the light emitted from the first light source 101 was 0.14. The light emitting device 200 was produced in the same manner as in Example 1 except that the first light source 101 was used. The light emission intensity (melanopic light emission intensity) $I_{PM}$ of the light emitting device of Comparative Example 4 was small since the light emission peak of the first fluorescent material 71 contained in the first light source 101 was 527 nm. Therefore, the light emission intensity ratio $I_{PM}/I_{PL}$ of the light emitting device of Comparative Example 4 was less than 0.22.

Table 19 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source 101 and the second light source 102 of the light emitting device 200 of Comparative Example 4. Table 20 shows the evaluation results of the light emitting device of Comparative Example 4.

TABLE 19

| | Comparative Example 4 | |
|---|---|---|
| | First light source | Second light source |
| Color temperature | 370745 K | 2720 K |
| Light emitting element | 446 nm nitride semiconductor | 446 nm nitride semiconductor |
| Fluorescent material | A2: 527 nm $Ca_8Mg(SiO_4)_4Cl_2:Eu$ (chlorosilicate) | A4-1: 533 nm $Y_3Al_5O_{12}:Ce$ (YAG) |
| | — | A4-2: 538 nm $Lu_3Al_5O_{12}:Ce$ (LAG) |
| | — | B1: 630 nm (Sr, Ca)$AlSiN_3$:Eu (SCASN) |
| Chromaticity x | 0.199 | 0.458 |
| Chromaticity y | 0.265 | 0.410 |
| duv | — | 0.00 |
| Ra | — | 82.0 |

TABLE 20

| | | | | | | | | | | | |
|---|---|---|---|---|---|---|---|---|---|---|---|
| | | | | Comparative Example 4 | | | | | | | |
| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
| Tcp (K) | Tcp (K) | duv | (lm/W) | x | y | Ra | R9 | R12 | ratio | efficiency | $I_{PM}/I_{PL}$ |
| 2700 | 2720 | 0.00 | 158 | 0.458 | 0.410 | 82.0 | 13.1 | 67.7 | 100 | 100 | — |
| 3000 | 2965 | 0.00 | 159 | 0.436 | 0.398 | 83.5 | 18.4 | 71.0 | 100 | 97 | — |
| 4000 | 3812 | −0.01 | 160 | 0.385 | 0.369 | 86.6 | 39.4 | 70.5 | 101 | 95 | — |
| 5000 | 4942 | 0.00 | 160 | 0.346 | 0.347 | 86.4 | 48.7 | 64.6 | 104 | 95 | — |
| 6500 | 6600 | 0.00 | 160 | 0.311 | 0.328 | 83.5 | 45.9 | 61.2 | 105 | 97 | — |
| First light source | 370745 | — | 148 | 0.199 | 0.265 | 0.0 | 0.0 | 0.0 | — | — | 0.14 |

The light emitting device of Comparative Example 4 provided mixed color light by toning the light emitted from the first light source and the light emitted from the 2,700 K second light source. For the color temperature of the mixed color light obtained by the light emitting device of Comparative Example 4, the relative melanopic ratios at around 4,000 K, around 5,000 K, and around 6,500 K were slightly higher than the emitted light from the light emitting device of Comparative Example 1 by from 1% to 5%, but the relative melanopic light emission efficiency was lower than the emitted light from the light emitting device of Comparative Example 1 by from 3% to 5%. The mixed color light emitted from the light emitting device of Comparative Example 4 had a light emission intensity ratio $I_{PM}/I_{PL}$ of 0.14, which was lower than the light emission intensity ratio $I_{PM}/I_{PL}$ of the mixed color light emitted from the light emitting device of Comparative Example 1, and had a low light emission efficiency, resulting in a low relative melanopic light emission efficiency, and the effect influencing the circadian rhythm per unit electric power consumption was low, providing a light emitting device that was not suitable as the illumination considering the circadian rhythm. The average color rendering index Ra, the special color rendering index R9, and the special color rendering index R12 of the mixed color light emitted from the light emitting device of Comparative Example 4 were equivalent to Comparative Example 1. This means that the light emitting device of Comparative Example 4 maintains the target light emission efficiency, but is not the illumination considering the circadian rhythm, as described above.

Figure 13:
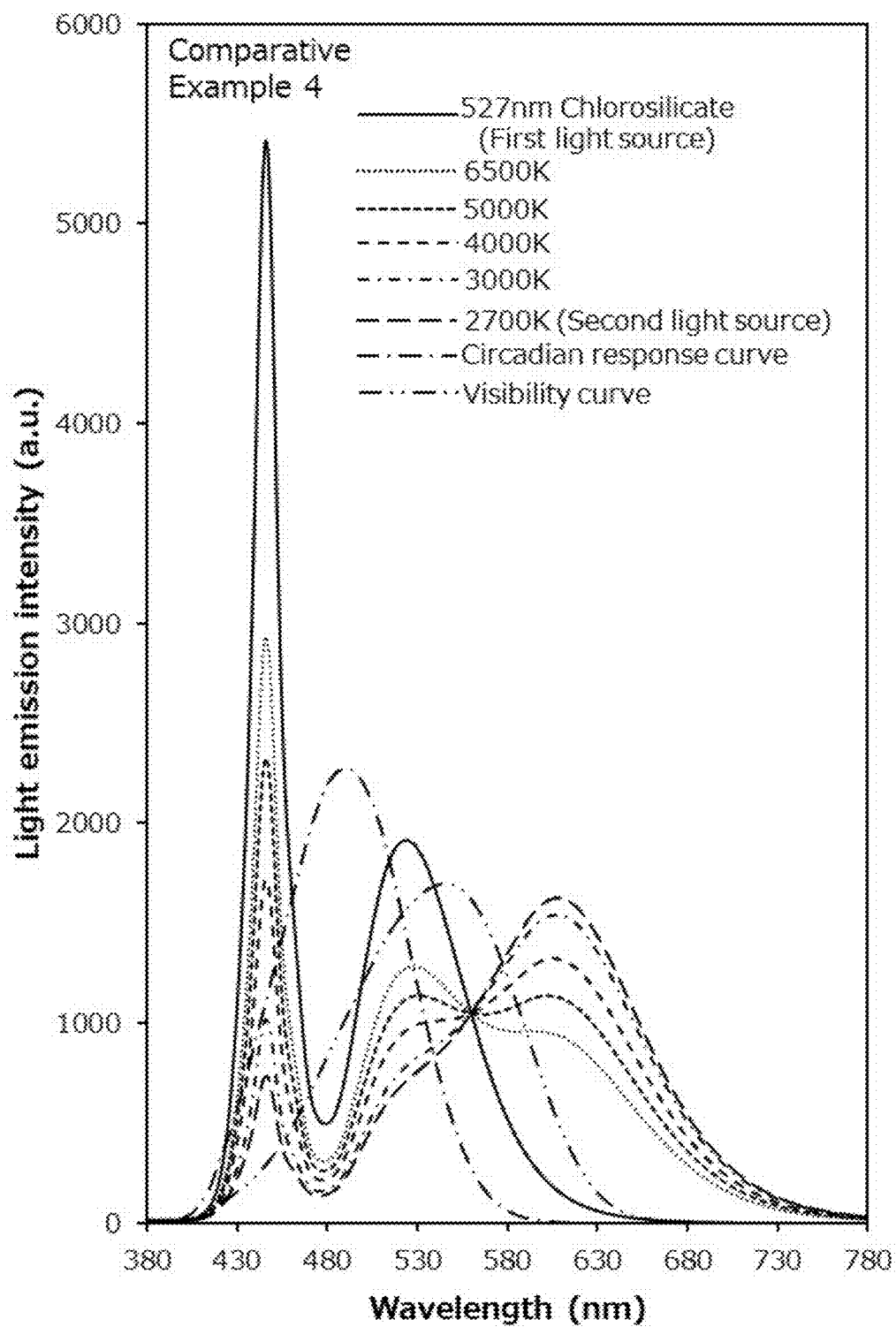
FIG. 13 is a diagram showing the light emission spectra of mixed color light emitted from the light emitting device of Comparative Example 4 at correlated color temperatures of 6,500 K, 5,000 K, 4,000 K, 3,000 K, and 2,700 K, the light emission spectrum of only the first light source thereof, the circadian response curve, and the visibility curve.

FIG. 13 is a diagram showing the light emission spectra of the light emitting device of Comparative Example 4 at correlated color temperatures of around 2,700 K, around 3,000 K, around 4,000 K, around 5,000 K, and around 6,500 K, the circadian response curve, and the visibility curve. In the light emission spectra of the light emitting device of Comparative Example 4, even though the correlated color temperature was increased from around 2,700 K to around 6,500 K, the light emission spectrum of the circadian component having a wavelength of from 480 nm to 490 nm stimulating the circadian rhythm was substantially not changed, and the light emitting device contained a small amount of the circadian component, and was not suitable as the illumination considering the circadian rhythm.

Comparative Example 5

A light emitting device was produced by using the first light source 101 described later and the second light source 102 set to have a correlated color temperature of around 2,700 K as similar to Example 1 (which may be hereinafter referred to as a "2,700 K second light source"). As the first fluorescent material 71 used in the first light source 101, a β-SiAlON fluorescent material having a light emission peak wavelength at 540 nm through excitation with the light emitted from the first light emitting element 11 and a full width at half maximum of 55 nm, having a composition represented by $Si_{6-z}Al_zO_zN_{8-z}$:Eu (0<z≤4.2) was used. The first fluorescent material 71 contained in the first light source 101 was used in such an amount that provided x of 0.234 (x=0.234) and y of 0.293 (y=0.293) in the chromaticity diagram of the CIE 1931 color coordinate system. The amount of the first fluorescent material 71 contained in the first light source 101 was such an amount that in the light emission spectrum of the light emitting device 200, the light emission intensity ratio $I_{PM}/I_{PL}$ of the light emission intensity $I_{PM}$ at a wavelength of 490 nm with respect to the light emission intensity $I_{PL}$ at the maximum light emission peak wavelength of the first light emitting element 11 derived from the light emitted from the first light source 101 was 0.02. The light emitting device 200 was produced in the same manner as in Example 1 except that the first light source 101 was used. The light emission intensity (melanopic light emission intensity) $I_{PM}$ of the light emitting device of Comparative Example 5 was small since the light emission peak of the first fluorescent material 71 contained in the first light source 101 was 540 nm. Therefore, the light emission intensity ratio $I_{PM}/I_{PL}$ of the light emitting device of Comparative Example 5 was less than 0.22.

Table 21 shows the set color temperatures, the light emitting elements, the first fluorescent material or the second fluorescent material, the coordinates x and y in the chromaticity diagram of the CIE 1931 color coordinate system, the color deviations, and the average color rendering indices of the first light source and the second light source of the light emitting device of Comparative Example 5. Table 22 shows the evaluation results of the light emitting device of Comparative Example 5.

TABLE 21

| | Comparative Example 5 | |
|---|---|---|
| | First light source | Second light source |
| Color temperature | 16875 K | 2720 K |
| Light emitting element | 446 nm nitride semiconductor | 446 nm nitride semiconductor |
| Fluorescent material | 540 nm $Si_{6-z}Al_zO_zN_{8-z}$ (0 < z ≤ 4.2) | A4-1: 533 nm $Y_3Al_5O_{12}$:Ce (YAG) |
| | — | A4-2: 538 nm $Lu_3Al_5O_{12}$:Ce (LAG) |
| | — | B1: 630 nm (Sr, Ca)$AlSiN_3$:Eu (SCASN) |
| | — | — |
| Chromaticity x | 0.234 | 0.458 |
| Chromaticity y | 0.293 | 0.410 |
| duv | — | 0.00 |
| Ra | — | 82.0 |

TABLE 22

| | Comparative Example 5 | | | | | | | | | | |
|---|---|---|---|---|---|---|---|---|---|---|---|
| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
| Tcp (K) | Tcp (K) | duv | (lm/W) | x | y | Ra | R9 | R12 | | | $I_{PM}/I_{PL}$ |
| 2700 | 2720 | 0.00 | 158 | 0.458 | 0.410 | 82.0 | 13.1 | 67.7 | 100 | 100 | — |
| 3000 | 3004 | 0.00 | 162 | 0.433 | 0.397 | 81.4 | 15.6 | 63.1 | 97 | 96 | — |

TABLE 22-continued

Comparative Example 5

| Set correlated color temperature | Correlated color temperature | Color deviation | Light emission efficiency | Chromaticity | | Color rendering index | | | Relative melanopic ratio | Relative melanopic light emission efficiency | Light emission intensity ratio |
|---|---|---|---|---|---|---|---|---|---|---|---|
| Tcp (K) | Tcp (K) | duv | (lm/W) | x | y | Ra | R9 | R12 | | | $I_{PM}/I_{PL}$ |
| 4000 | 3860 | 0.00 | 169 | 0.384 | 0.371 | 79.2 | 24.0 | 49.0 | 92 | 91 | — |
| 5000 | 4991 | 0.00 | 175 | 0.345 | 0.351 | 74.5 | 18.0 | 36.1 | 90 | 90 | — |
| 6500 | 6615 | 0.01 | 180 | 0.310 | 0.332 | 67.6 | −5.0 | 28.0 | 89 | 92 | — |
| First light source | 16875 | — | 185 | 0.234 | 0.293 | 0.0 | 0.0 | 0.0 | — | — | 0.02 |

The light emitting device of Comparative Example 5 was a light emitting device that provided mixed color light by toning the light emitted from the first light source and the light emitted from the 2,700 K second light source. For the color temperature of the mixed color light obtained by the light emitting device of Comparative Example 5, the relative melanopic ratios around 3,000 K, around 4,000 K, around 5,000 K, and around 6,500 K were lower than the emitted light from the light emitting device of Comparative Example 1, and the relative melanopic light emission efficiency was also lower than the emitted light from the light emitting device of Comparative Example 1. The mixed color light emitted from the light emitting device of Comparative Example 5 had a light emission intensity ratio $I_{PM}/I_{PL}$ of 0.02, which was considerably lower than the light emission intensity ratio $I_{PM}/I_{PL}$ of the mixed color light emitted from the light emitting device of Comparative Example 1, and had a low light emission efficiency, resulting in a low relative melanopic ratio and a low relative melanopic light emission efficiency, and there was substantially no effect influencing the circadian rhythm, providing a light emitting device that was not suitable as the illumination considering the circadian rhythm. The average color rendering index Ra, the special color rendering index R9, and the special color rendering index R12 of the mixed color light emitted from the light emitting device of Comparative Example 5 were also lower than Comparative Example 1, and the light emitting device of Comparative Example 5 failed to maintain the target light emission efficiency.

Figure 14:
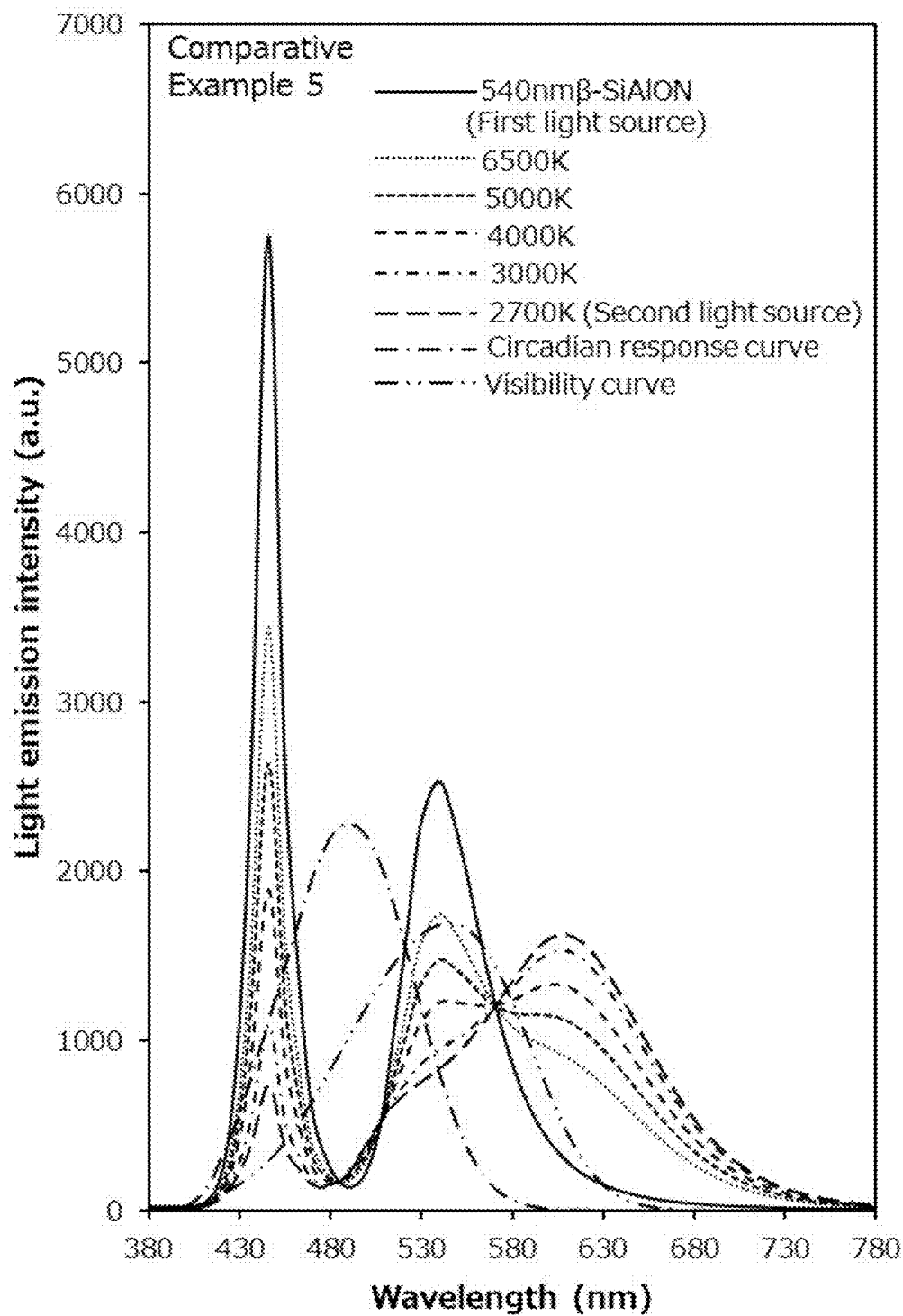
FIG. 14 is a diagram showing the light emission spectra of mixed color light emitted from the light emitting device of Comparative Example 5 at correlated color temperatures of 6,500 K, 5,000 K, 4,000 K, 3,000 K, and 2,700 K, the light emission spectrum of only the first light source thereof, the circadian response curve, and the visibility curve.

FIG. 14 is a diagram showing the light emission spectra of the light emitting device of Comparative Example 5 at correlated color temperatures of around 2,700 K, around 3,000 K, around 4,000 K, around 5,000 K, and around 6,500 K, the circadian response curve, and the visibility curve. In the light emission spectra of the light emitting device of Comparative Example 5, even though the correlated color temperature was increased from around 2,700 K to around 6,500 K, the light emission spectrum of the circadian component having a wavelength of from 480 nm to 490 nm stimulating the circadian rhythm was substantially not changed. Accordingly, the light emitting device of Comparative Example 5 was not suitable as the illumination considering the circadian rhythm.

The light emitting device of an embodiment of the present disclosure is capable of achieving simultaneously both the control of the melanopic ratio considering the circadian rhythm and the maintenance of the light emission efficiency. Accordingly, the light emitting device of an embodiment of the present disclosure enables an illumination suitable for the concept of HCL, and thus can be applied to a light emitting device for an illumination considering the circadian rhythm in accordance with the WELL Certification.

The invention claimed is:

1. A light emitting device comprising:
a first light source containing a first light emitting element having a light emission peak wavelength in a range of 410 nm or more and 490 nm or less,
wherein the first light source emits light in a region that is demarcated in a chromaticity diagram of the CIE 1931 color coordinate system by a first straight line connecting a first point having x of 0.280 and y of 0.070 in the chromaticity coordinate and a second point having x of 0.280 and y of 0.500 in the chromaticity coordinate, a second straight line connecting the second point and a third point having x of 0.013 and y of 0.500 in the chromaticity coordinate, a purple boundary extending from the first point toward a direction in which x decreases in the chromaticity coordinate, and a spectrum locus extending from the third point toward a direction in which y decreases in the chromaticity coordinate,
wherein in a light emission spectrum, a light emission intensity ratio $I_{PM}/I_{PL}$ of a light emission intensity $I_{PM}$ at a wavelength of 490 nm with respect to a light emission intensity $I_{PL}$ at a maximum light emission peak wavelength of the first light emitting element is in a range of 0.22 or more and 0.95 or less.

2. The light emitting device according to claim 1, wherein the first light source contains a first fluorescent material that emits light through excitation by the first light emitting element.

3. The light emitting device according to claim 2, wherein the first fluorescent material contains at least one fluorescent material A having a light emission peak wavelength in a range of 440 nm or more and 526 nm or less, selected from the group consisting of
(A1) an alkaline earth metal aluminate salt fluorescent material activated with Eu, having a full width at half maximum in the light emission spectrum in a range of 58 nm or more and 78 nm or less,
(A2) a silicate salt fluorescent material activated with Eu, having a composition including Mg, at least one element selected from the group consisting of Ca, Sr, and Ba, and at least one element selected from the group consisting of F, Cl, and Br, and having a full width at half maximum in the light emission spectrum in a range of 50 nm or more and 75 nm or less,
(A3) a silicate salt fluorescent material activated with Eu, having a composition including at least one element selected from the group consisting of Ba, Sr, and Ca, and having a full width at half maximum in the light emission spectrum in a range of 50 nm or more and 75 nm or less, and (A4) a rare earth aluminate salt fluorescent material activated with Ce, having a composition including at least one rare earth element selected from the group consisting of Y, Gd, Tb, and Lu, and at least one element selected from the group consisting of Al and Ga, having a full width at half maximum in the light emission spectrum in a range of 90 nm or more and 115 nm or less.

4. The light emitting device according to claim 2, wherein the first fluorescent material is at least one selected from the group consisting of an alkaline earth metal aluminate salt fluorescent material having a composition represented by the following formula (a1), a silicate salt fluorescent material having a composition represented by the following formula (a2), a silicate salt fluorescent material having a composition represented by the following formula (a3), and a rare earth aluminate salt fluorescent material having a composition represented by the following formula (a4):

$$Sr_4Al_{14}O_{25}:Eu \qquad (a1)$$

$$(Ca,Sr,Ba)_8MgSi_4O_{16}(F,Cl,Br)_2:Eu \qquad (a2)$$

$$(Ca,Sr,Ba)_2SiO_4:Eu \qquad (a3)$$

$$(Y,Gd,Tb,Lu)_3(Al,Ga)_5O_{12}:Ce \qquad (a4).$$

* * * * *